US012685223B2

(12) United States Patent
Mun

(10) Patent No.: US 12,685,223 B2
(45) Date of Patent: Jul. 14, 2026

(54) SEMICONDUCTOR PACKAGE AND MANUFACTURING METHOD THEREOF

(71) Applicant: Samsung Electronics Co., Ltd., Suwon-si (KR)

(72) Inventor: Kyungdon Mun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 506 days.

(21) Appl. No.: 18/185,248

(22) Filed: Mar. 16, 2023

(65) Prior Publication Data

US 2024/0021579 A1 Jan. 18, 2024

(30) Foreign Application Priority Data

Jul. 18, 2022 (KR) ........................ 10-2022-0088587

(51) Int. Cl.
H10W 90/00 (2026.01)
H10B 80/00 (2026.01)
(Continued)

(52) U.S. Cl.
CPC ............ H10W 90/00 (2026.01); H10B 80/00 (2023.02); H10W 20/20 (2026.01);
(Continued)

(58) Field of Classification Search
CPC ............. H01L 25/0657; H01L 23/3128; H01L 23/481; H01L 23/49811; H01L 23/5389; H01L 24/16; H01L 24/08; H10W 90/00; H10W 90/792; H10W 90/701; H10W 90/724; H10W 20/20; H10W 70/614; H10W 74/117
See application file for complete search history.

(56) References Cited

U.S. PATENT DOCUMENTS 8,754,514 B2 6/2014 Yu et al.
9,490,167 B2 11/2016 Chen et al.
(Continued)

FOREIGN PATENT DOCUMENTS

KR 10-2021-0110008 A 9/2021
KR 10-2021-0152772 A 12/2021
KR 10-2022-0058683 A 5/2022

OTHER PUBLICATIONS

Office Action in Korean Appln. No. 10-2022-0088587, mailed on Nov. 21, 2025, 17 pages (with English translation).

*Primary Examiner* — John M Parker

(74) *Attorney, Agent, or Firm* — Fish & Richardson P.C.

(57) ABSTRACT

A semiconductor package having a signal transfer path between semiconductor chips and a method of manufacturing the semiconductor package are provided. The semiconductor package includes a first redistribution substrate, a semiconductor chip stack arranged on the first redistribution substrate and including a lower chip and an upper chip, a through post arranged on the first redistribution substrate around the semiconductor chip stack, and a second redistribution substrate arranged on the semiconductor chip stack and the through post. The upper chip includes a through-electrode arranged on an integrated circuit layer, and has a front surface, which is an active face and faces the lower chip, and a back surface, which is an inactive face and faces the second redistribution substrate.

18 Claims, 29 Drawing Sheets

(51) Int. Cl.
    *H10W 20/20*      (2026.01)
    *H10W 70/60*      (2026.01)
    *H10W 74/10*      (2026.01)

(52) U.S. Cl.
    CPC ........ *H10W 70/614* (2026.01); *H10W 74/117*
        (2026.01); *H10W 90/701* (2026.01); *H10W*
        *90/724* (2026.01); *H10W 90/792* (2026.01)

(56)            References Cited

U.S. PATENT DOCUMENTS

| | | | |
|---|---|---|---|
| 9,583,472 B2 | 2/2017 | Chung et al. | |
| 10,043,779 B2 | 8/2018 | Prabhu et al. | |
| 10,050,024 B2 | 8/2018 | Hung et al. | |
| 11,217,563 B2 | 1/2022 | Zhai | |
| 11,302,674 B2 | 4/2022 | Gandhi et al. | |
| 11,942,458 B2 * | 3/2024 | Lee | H01L 23/49816 |
| 2012/0211892 A1 * | 8/2012 | Kim | H01L 24/97 |
| | | | 257/774 |
| 2017/0084589 A1 * | 3/2017 | Kuo | H01L 23/3128 |
| 2019/0333893 A1 | 10/2019 | Yu et al. | |
| 2020/0343223 A1 * | 10/2020 | Chen | H01L 23/5385 |
| 2021/0043576 A1 * | 2/2021 | Yang | H01L 23/481 |
| 2021/0296288 A1 * | 9/2021 | Chen | H01L 23/5383 |

* cited by examiner

SEMICONDUCTOR PACKAGE AND MANUFACTURING METHOD THEREOF

CROSS-REFERENCE TO RELATED APPLICATION

This application is based on and claims priority under 35 U.S.C. § 119 to Korean Patent Application No. 10-2022-0088587, filed on Jul. 18, 2022, in the Korean Intellectual Property Office, the disclosure of which is incorporated by reference herein in its entirety.

BACKGROUND

Due to the great progress of the electronics industry and user requests, electronic devices have become smaller and lighter. As the size and the weight of electronic devices continues to decrease, semiconductor packages for the electronic devices have been also reduced in size and weight. Furthermore, semiconductor packages require high performance, high capacity, as well as high reliability. Generally, high performance and capacity demands on a semiconductor package cause high power consumption. Thus, the structures of the semiconductor packages relating to the size, performance, and a stable power supply have become important.

SUMMARY

The present disclosure relates to semiconductor packages, and in particular semiconductor packages including a redistribution substrate at an upper portion and at a lower portion of a semiconductor chip, and methods of manufacturing the same. Within a semiconductor package that includes an upper and a lower chip, there can be a shortened path between the upper and lower chips, e.g., a path from the surfaces of the upper and lower chips that face each other. Configuring the semiconductor package such that the signal transfer path is along this shortened path can, in some implementations, reduce heat, improve signal integrity (SI), and increase in performance as a function of power consumed in the semiconductor package.

In addition, the problems to be solved by the inventive concept are not limited to the above-described problems, and some other problems are clearly understood by one of ordinary skill in the art from the following descriptions hereinafter.

In general, innovative aspects of the subject matter described in this specification can be embodied in a semiconductor package that includes: a first redistribution substrate; semiconductor chip stack arranged on the first redistribution substrate, where the semiconductor chip stack includes a lower chip and an upper chip; a through post arranged on the first redistribution substrate around the semiconductor chip stack; and a second redistribution substrate arranged on the semiconductor chip stack and the through post. The upper chip can include a through-electrode arranged on an integrated circuit layer. The upper chip has a front surface, which is an active face, that faces the lower chip, and has a back surface, which is an inactive face, that faces the second redistribution substrate.

In general, in another aspect, the subject matter of the present disclosure can be embodied in a semiconductor package that includes: a first redistribution substrate; semiconductor chip stack arranged on the first redistribution substrate, in which the semiconductor chip stack includes a lower chip and an upper chip; a through post arranged on the first redistribution substrate around the semiconductor chip stack; an encapsulant enclosing a side surface of the through post and covering the semiconductor chip stack to seal the semiconductor chip stack; a second redistribution substrate arranged on the encapsulant and the through post; and an external contact terminal arranged on a lower surface of the first redistribution substrate in a Fan-Out (FO) structure, in which the upper chip includes an integrated circuit layer, a through-electrode on the integrated circuit layer, an upper wiring layer on the through-electrode, and a lower wiring layer under the integrated circuit layer.

In general, in another aspect, the subject matter of the present disclosure can be embodied in a semiconductor package that includes: a lower package; an upper package stacked on the lower package though an inter-substrate contact terminal; an external contact terminal arranged on a lower surface of the lower package in a fan-out (FO) structure, in which the lower package includes a first redistribution substrate, semiconductor chip stack arranged on the first redistribution substrate, where the semiconductor chip stack includes a lower chip and an upper chip; a through post arranged on the first redistribution substrate around the semiconductor chip stack; and a second redistribution substrate arranged on the semiconductor chip stack and the through post. The upper chip includes an integrated circuit layer, a through-electrode arranged on the integrated circuit layer, an upper wiring layer on the through-electrode, and a lower wiring layer under the integrated circuit layer.

In general, in another aspect, the subject matter of the present disclosure can be embodied in methods that include: forming a semiconductor chip stack that has a lower chip and an upper chip; forming a first redistribution substrate on a carrier substrate; forming a through post on a peripheral portion of the first redistribution substrate; arranging the semiconductor chip stack on a central portion of the first redistribution substrate; forming an encapsulant covering the through post and the stack semiconductor package; planarizing an upper portion of the encapsulant to expose an upper surface of the through post; and forming a second redistribution substrate on the through post and the encapsulant, in which forming of the semiconductor chip stack includes forming the upper chip having a through-electrode on an integrated circuit layer, and stacking the upper chip on the lower chip.

BRIEF DESCRIPTION OF THE DRAWINGS

The subject matter disclosed herein will be more clearly understood from the following detailed description taken in conjunction with the accompanying drawings in which.

DETAILED DESCRIPTION

Figure 1:
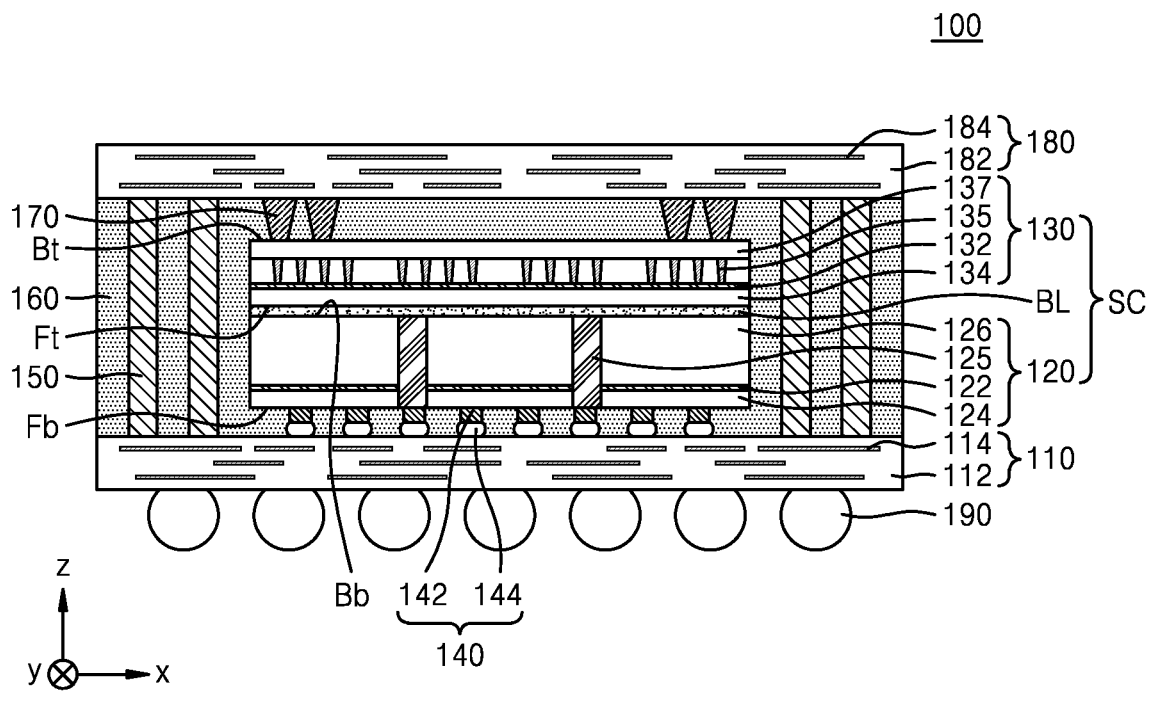
FIG. 1 is a cross-sectional view illustrating a structure of an example of a semiconductor package.

Hereinafter, various aspects are described in detail with reference to accompanying drawings. In the drawings, the same reference numerals denote the same elements throughout, and detailed descriptions on the same elements are omitted.

FIG. 1 is a cross-sectional view illustrating a structure of an example of a semiconductor package.

Referring to the example of FIG. 1, a semiconductor package 100 includes a first redistribution substrate 110, a semiconductor chip stack SC, a through post 150, an encapsulant 160, a vertical contact 170, a second redistribution substrate 180, and an external contact terminal 190.

The first redistribution substrate 110 is arranged under the semiconductor chip stack SC, and may redistribute chip pads of the semiconductor chip stack SC to the outside of the semiconductor chip stack SC. In some implementations, the first redistribution substrate 110 includes a first body insulation layer 112, and a first redistribution line 114. The first redistribution line 114 may be configured as a multilayer structure that is interconnected by a via.

The first body insulation layer 112 includes an insulation material, such as photo imageable dielectric (PID) resin, and may further include an inorganic filler. However, the materials of the first body insulation layer 112 are not limited to the materials described above. In some implementations, the first body insulation layer 112 is configured as a multilayer structure, similar to how the first redistribution line 114 is configured as a multilayer structure. However, in FIG. 1, the first body insulation layer 112 is illustrated as a single layer structure for convenience. When configured as a multilayer structure, the first body insulation layer may 112 may include the same material or different materials.

The external contact terminal 190 may be arranged on a lower surface of the first body insulation layer 112. The external contact terminal 190 may be arranged on an external contact pad that is arranged on the lower surface of the first body insulation layer 112. The external contact terminal 190 may be connected to the semiconductor chip stack SC through the first redistribution line 114 of the first redistribution substrate 110, and through a bump 140. In some implementations, the bump 140 includes a pillar 142 and solder 144. In another implementation, the bump 140 may include only the solder 144.

The external contact terminal 190 may be positioned at a first portion of a lower surface of the first redistribution substrate 110 corresponding to a lower surface of the semiconductor chip stack SC, and be positioned at a second portion of the lower surface of the first redistribution substrate 110 enlarged outwards from the first portion in a first direction (x-direction) and a second direction (y-direction). Thus, the first redistribution substrate 110 may redistribute the bump 140 of the semiconductor chip stack SC to an enlarged area larger than the lower surface of the semiconductor chip stack SC through the first redistribution line 114 and the external contact terminal 190. Hereinafter, a package structure in which the external contact terminal 190 is positioned in an area larger than the lower surface of the semiconductor chip stack SC is referred to as fan-out (FO)

structure. In contrast, a package structure in which the external contact terminal 190 is positioned in only an area corresponding to the lower surface of the semiconductor chip stack SC is referred to as fan-in (FI) structure hereinafter.

The semiconductor chip stack SC may be mounted on the first redistribution substrate 110 via the bump 140. As illustrated in FIG. 1, the semiconductor chip stack SC may be positioned at a central portion of the first redistribution substrate 110 in the first direction (x-direction). In addition, the semiconductor chip stack SC may be positioned at a central portion of the first redistribution substrate 110 also in the second direction (y-direction).

The semiconductor chip stack SC may include a lower chip 120 and an upper chip 130. The lower chip 120 may be bonded to the upper chip 130 by a bonding layer BL. In some implementations, the bonding layer BL includes a hybrid bonding (HB) structure. The HB structure may refer to a structure in which pad-to-pad bonding and insulator-to-insulator bonding are combined, wherein in pad-to-pad bonding, chip pads of the lower chip 120 are bonded to those of the upper chip 130, respectively, and in insulator-to-insulator bonding, insulation layers of the lower chip 120 are bonded to those of the upper chip 130. As chip pads typically comprise copper (Cu), the pad-to-pad bonding is sometimes referred to as copper-to-copper bonding. In addition, an insulation layer of the insulator-to-insulator bonding may include silicon oxide ($SiO_2$). However, the material of the insulation layer is not limited to silicon oxide ($SiO_2$).

In addition, the bonding structure of the bonding layer BL for the semiconductor chip stack SC is not limited to an HB structure. In some implementations, the bonding structure of the bonding layer BL for the semiconductor chip stack SC includes, for example, a bonding structure by using an anisotropic conductive film (ACF), or a bonding structure by using a contact member, such as a bump or a solder ball. In the bonding structure by using the ACF, the ACF may include an anisotropic conductive layer through which electrical currents flow only in a single direction. The anisotropic conductive layer may refer to a film including conductive minute particles mixed with adhering resin.

The lower chip 120 of the semiconductor chip stack SC may include an analog chip. In some implementations, the lower chip 120 includes a modem chip for supporting telecommunication operation of the upper chip 130. However, the lower chip 120 is not limited to an analog chip and a modem chip. In some implementations, the lower chip 120 includes various integrated circuit devices for supporting various operations of the upper chip 130.

The lower chip 120 may include an integrated circuit layer 122, a wiring layer 124, a through-electrode 125, and a body layer 126. The body layer 126 may be provided as a body of the lower chip 120, and be based on a silicon substrate. The integrated circuit layer 122 may be arranged on a lower portion of the body layer 126, and may include a plurality of integrated circuit devices. The wiring layer 124 may be arranged on a lower portion of the integrated circuit layer 122, and include an insulation layer and a plurality of multilayered wirings in the insulation layer. The through-electrode 125 has a structure penetrating silicon constituting the body layer 126, and thus may be referred to as a through silicon via (TSV).

The through-electrode 125 may include a via-first structure in which the through-electrode 125 is formed prior to forming of the integrated circuit layer 122, a via-middle structure in which the through-electrode 125 is formed after forming of the integrated circuit layer 122 and prior to the wiring layer 124, and a via-last structure in which the through-electrode 125 is formed after forming of the wiring layer 124. In FIG. 1, the through-electrode 125 may correspond to a via-last structure. However, the through-electrode 125 of the semiconductor package 100 may also be configured to have a via-first structure or a via-middle structure.

While a pair of through-electrodes 125 are illustrated in FIG. 1, a few dozens to a few hundreds of through-electrodes 125 may be provided with the lower chip 120. In addition, while the through-electrode 125 of the lower chip 120 is illustrated in a relatively large scale so as to compare the through-electrode 125 with a nano through-electrode 135 of the upper chip 130 in FIG. 1, the through-electrode 125 may actually have a much smaller size than the lower chip 120.

In some implementations, a lower surface of the lower chip 120 is a front surface Fb that is an active face, and an upper surface of the lower chip 120 is a back surface Bb that is an inactive face. That is, a lower surface of the wiring layer 124 may correspond to the front surface Fb of the lower chip 120, and an upper surface of the body layer 126 may correspond to the back surface Bb of the lower chip 120. The chip pads may be typically arranged on the front surface Fb that is an active face.

The upper chip 130 may include a plurality of logic devices. In some implementations, a logic device includes a logic circuit, such as an AND circuit, an OR circuit, a NOT circuit, and a flip-flop circuit, and various signal processes may be performed by the logic device. In some implementations, the upper chip 130 includes an application processor (AP) chip. The upper chip 130 may be referred to as a control chip, a process chip or a central processing unit (CPU) chip according to functions thereof.

The upper chip 130 may include an integrated circuit layer 132, a lower wiring layer 134, a nano through-electrode 135, and an upper wiring layer 137. The integrated circuit layer 132 may include a plurality of integrated circuit devices. The lower wiring layer 134 may be positioned at a lower portion of the integrated circuit layer 132, and include an insulation layer, and a plurality of multilayered wirings in the insulation layer.

The nano through-electrode 135 may be arranged on the integrated circuit layer 132, or may be arranged on the integrated circuit layer 132 such that the nano through-electrode 135 penetrates through the integrated circuit layer 132. The nano through-electrode 135 may connect integrated circuit devices of the integrated circuit layer 132 to the upper wiring layer 137, or may connect the lower wiring layer 134 to the upper wiring layer 137. The nano through-electrode 135 may have a minute size, as suggested by the name of the nano through-electrode 135. In some implementations, the nano through-electrode 135 has a height less than or equal to about 100 nm. The word 'height' indicates a vertical size in a third direction (z-direction). When discussing ranges, "about" can refer to a range of values slightly above or below the indicated amount, e.g., a range spanning 10% more or less than the indicated amount, 5% more or less than the indicated amount, or 1% more or less than the indicated amount. The nano through-electrode 135 may have a cylindrical shape or a multifaceted cylindrical shape having a diameter or a width of a few tens of nanometers. However, the size of the nano through-electrode 135 is not limited to the numerals described above. In some implementations, the nano through-electrode 135 has a height more than about 100 nm. The method of forming the nano through-electrode 135 is described in detail with reference to FIGS. 7A to 7E.

The upper wiring layer 137 may be arranged on the nano through-electrode 135 and include an insulation layer, and a plurality of multilayered wirings in the insulation layer. The upper wiring layer 137 may be formed by a similar method as a method of forming the lower wiring layer 134. That is, the upper wiring layer 137 may be formed by a wiring process for forming a plurality of multilayered wirings on the nano through-electrode 135. As described above, the nano through-electrode 135 may be connected to the wirings of the upper wiring layer 137.

A lower surface of the upper chip 130 may be a front surface Ft that is an active face, and an upper surface of the upper chip 130 may be a back surface Bt that is an inactive face. That is, a lower surface of the lower wiring layer 134 may correspond to the front surface Ft of the upper chip 130, and an upper surface of the upper wiring layer 137 may correspond to the back surface Bt of the upper chip 130. The chip pads of the upper chip 130 may be arranged on both of the front surface Ft and the back surface Bt. That is, the chip pads may be arranged on the front surface Ft or the lower surface of the lower wiring layer 134, and may be connected to the wirings of the lower wiring layer 134. As the upper wiring layer 137 is positioned on an upper portion of the upper chip 130, the chip pads may be arranged on the back surface Bt or the upper surface of the upper wiring layer 137, and may be connected to the wirings of the upper wiring layer 137.

A through post 150 may be positioned between the first redistribution substrate 110 and the second redistribution substrate 180. The through post 150 can be laterally spaced apart from the semiconductor chip stack SC. The encapsulant 160 may be provided between the first redistribution substrate 110 and the second redistribution substrate 180. Thus, the through post 150 may extend penetrating through the encapsulant 160. The through post 150 may electrically connect the first redistribution substrate 110 to the second redistribution substrate 180. In some implementations, the through post 150 is connected to the first redistribution line 114 of the first redistribution substrate 110, and be connected to a second redistribution line 184 of the second redistribution substrate 180.

In some implementations, the through post 150 includes copper (Cu). However, the material of the through post 150 is not limited to copper (Cu). The through post 150 may be formed by an electroplating process using a seed metal. Thus, a seed metal 155a in FIG. 9F may be formed on the first redistribution substrate 110, and the through post 150 may be formed on the seed metal 155a. In some implementations, the seed metal 155a includes various metal materials, such as copper (Cu), titanium (Ti), tantalum (Ta), titanium nitride (TiN), and tantalum nitride (TaN). In some implementations, the seed metal 155a is provided as a portion of the through post 150. In some implementations, the seed metal 155a includes copper (Cu), and the through post 150 may also include copper (Cu). Thus, the seed metal 155a is not additionally illustrated in FIG. 1.

The encapsulant 160 may be provided between the first redistribution substrate 110 and the second redistribution substrate 180. The encapsulant 160 may cover side and top surfaces of the semiconductor chip stack SC to seal the semiconductor chip stack SC. Furthermore, the encapsulant 160 may enclose the side of the through post 150. In some implementations, the encapsulant 160 fills a gap space between the first redistribution substrate 110 and the semiconductor chip stack SC, and between the bumps 140 under the semiconductor chip stack SC. In another implementation, the gap space between the bumps 140 may be filled with an underfill under the semiconductor chip stack SC, and the encapsulant 160 may cover the semiconductor chip stack SC and the underfill.

The encapsulant 160 may include insulation material. Examples of the insulation material may include a thermosetting resin, such as an epoxy resin, a thermoplastic resin, such as a polyimide resin, or a reinforced resin mixed with reinforcing agents, such as inorganic fillers. The reinforced resin may include an ajinomoto build-up film (ABF), a flame retardant 4 (FR-4), or a bismaleimide triagine (BT) resin. In addition, the encapsulant 160 may include a molding material, such as an epoxy molding compound (EMC), or a photosensitive material, such as a photo imageable encapsulant (PIE). However, the material for the encapsulant 160 is not limited to the materials described above.

The vertical contact 170 may penetrate through the encapsulant 160 on the upper surface of the semiconductor chip stack SC to connect the semiconductor chip stack SC to the second redistribution substrate 180. In some implementations, a lower surface of the vertical contact 170 is connected to the wirings of the upper wiring layer 137 of the upper chip 130 of the semiconductor chip stack SC, and an upper surface of the vertical contact 170 may be connected to the second redistribution line 184 of the second redistribution substrate 180. The vertical contact 170 may also be connected to the wirings of the upper wiring layer 137 via the chip pads that are arranged on the upper wiring layer 137. In addition, the vertical contact 170 may be connected to the second redistribution line 184 of the second redistribution substrate 180 via substrate pads that are arranged on the lower surface of the second redistribution substrate 180.

The second redistribution substrate 180 may be positioned on the through post 150 and the encapsulant 160. The second redistribution substrate 180 may have a structure that is similar to the structure of the first redistribution substrate 110. In some implementations, the second redistribution substrate 180 includes a second body insulation layer 182, and the second redistribution line 184. The second body insulation layer 182 and the second redistribution line 184 may respectively have substantially the same structures as the first body insulation layer 112 and the first redistribution line 114 of the first redistribution substrate 110 described above. The second redistribution line 184 of the second redistribution substrate 180 may be electrically connected to the external contact terminal 190 through the through post 150 and the first redistribution line 114 of the first redistribution substrate 110.

The external contact terminal 190 may be arranged on an external contact pad that is arranged on the lower surface of the first redistribution substrate 110, and may be electrically connected to the first redistribution line 114 through the external contact pad. The semiconductor package 100 may be connected to a package substrate of an external system or a main board of an electronic apparatus, such as a mobile phone. The external contact terminal 190 may include conductive materials. The conductive materials may include at least any one of solder, tin (Sn), silver (Ag), copper (Cu), and aluminum (Al).

Figure 4:
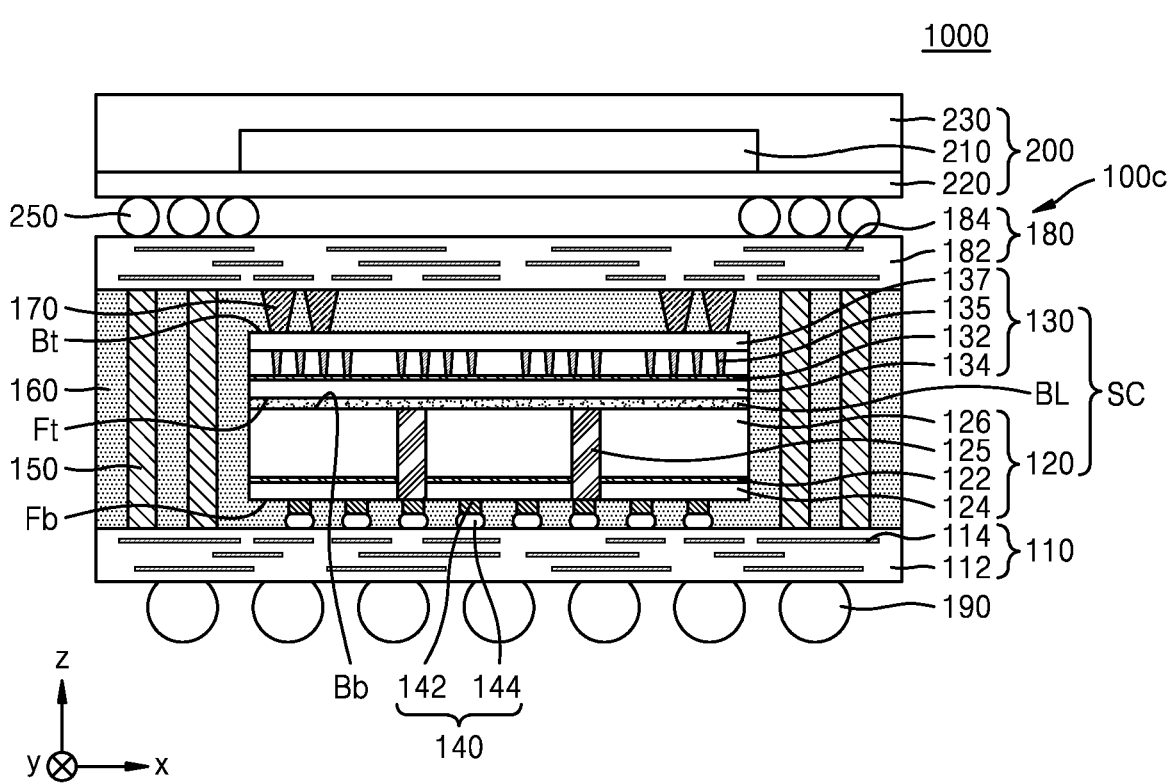
FIG. 4 is a cross-sectional view illustrating an example of a semiconductor package.

An upper package 200 in FIG. 4 including a memory chip may be stacked on an upper surface of the second redistribution substrate 180 via inter-substrate contact terminals 250 in FIG. 4. A structure of a semiconductor package in which the upper package 200 is stacked on the second redistribution substrate 180 may correspond to a package on package (POP) structure. The semiconductor package having the POP structure is described in detail with reference to FIG. 4. In another implementation, at least one semiconductor chip 210 in FIG. 6 and/or at least one passive device 240 in FIG. 6 may be stacked directly on the upper surface of the second redistribution substrate 180. The semiconductor package having the semiconductor chip and/or the passive device is described in detail with reference to FIG. 6.

In some implementations, the semiconductor chip stack SC includes the lower chip 120 and the upper chip 130 such that the upper chip 130 may include the nano through-electrode 135 and the upper wiring layer 137. In addition, the vertical contact 170 may be positioned between the semiconductor chip stack SC and the second redistribution substrate 180. In some implementations, the upper chip 130 of the semiconductor chip stack SC is connected to the second redistribution line 184 of the second redistribution substrate 180 by a shortened signal path through the nano through-electrode 135, the upper wiring layer 137, and the vertical contact 170. For example, in FIG. 4, the shortened signal path between the semiconductor chip stack SC and the second redistribution line 184 goes from the bottom of the nano through-electrode 135, through the upper wiring layer 137, to the top of the vertical contact 170. Due to the presence of the nano through-electrode 135 and upper wiring layer 137, a vertical contact 170 can connect the semiconductor chip stack SC and second redistribution substrate 180. Accordingly, in some implementations, the upper chip 130, which includes an AP chip, has a shortened signal transfer path between the AP chip and the memory chip of the upper package 200 on the second redistribution substrate 180 or between the AP chip and the memory chip directly mounted on the second redistribution substrate 180. Thus, the operation performance of the semiconductor package 100 may be sufficiently improved in a view of system level, based on the shortened signal transfer path. The operation performance may include heat reduction, improvement of signal integrity (SI), and increase in performance ratio to the power consumption. The signal transfer path in the semiconductor package 100 is described in detail with reference to FIGS. 5A and 5B.

Figure 2:
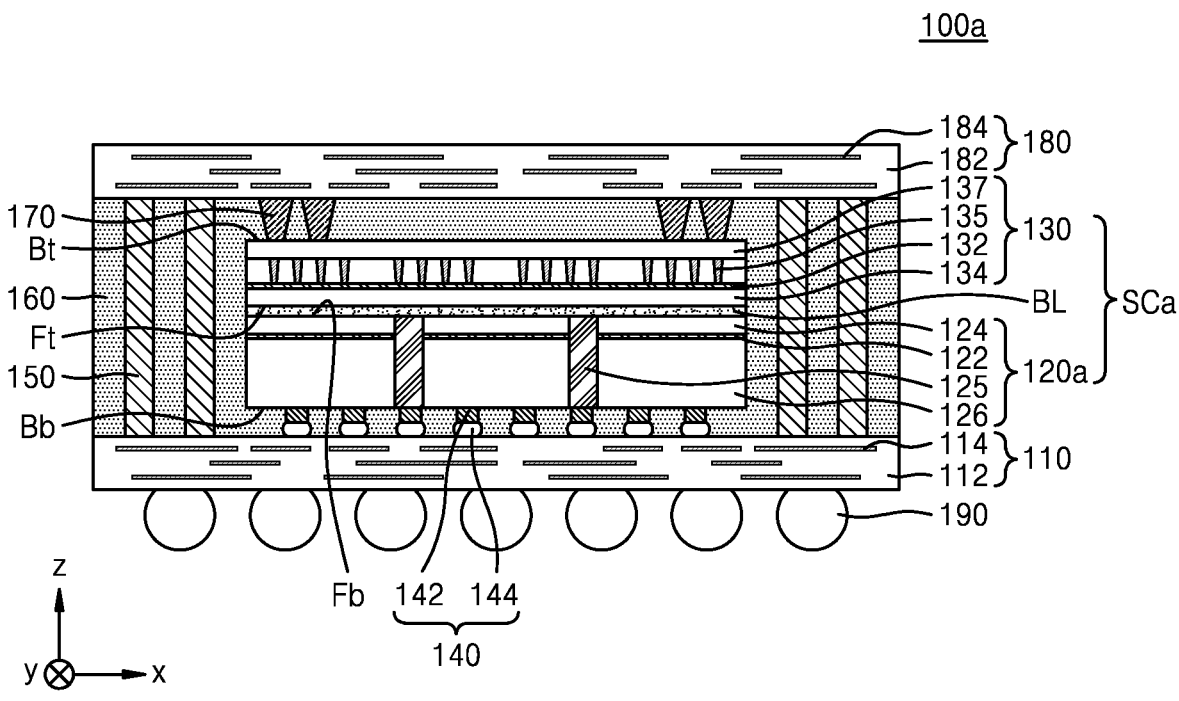
FIGS. 2 and 3 are cross-sectional views illustrating a structure of another example of a semiconductor package.
Figure 3:
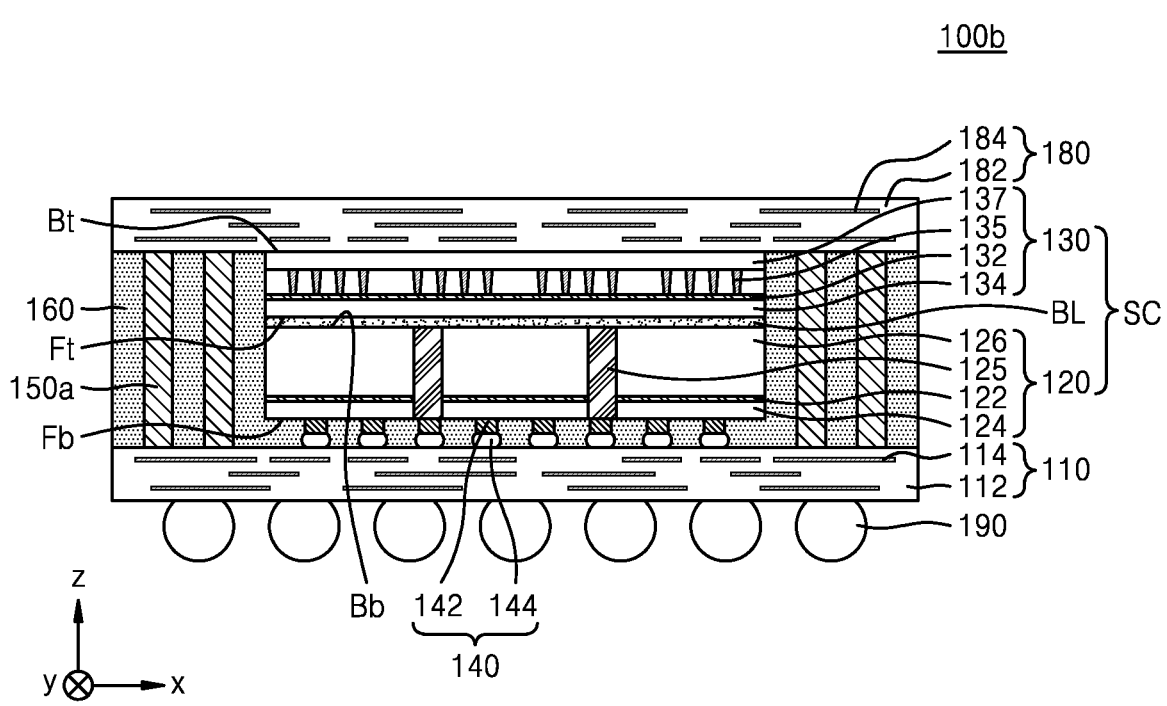

FIG. 2 is a cross-sectional view illustrating an example of a semiconductor package. FIG. 3 is a cross-sectional view illustrating another example of a semiconductor package. The same descriptions as given with reference to FIG. 1 are given briefly or omitted.

Referring to FIG. 2, a semiconductor package 100a may have a semiconductor chip stack SCa that is different from the semiconductor chip stack Sc of the semiconductor package 100 in FIG. 1. In some implementations, the semiconductor chip stack SCa of the semiconductor package 100a includes a lower chip 120a and the upper chip 130. The lower chip 120a may be combined with the upper chip 130 by the bonding layer BL. In some implementations, the bonding layer BL includes an HB structure. However, the structure of the bonding layer BL is not limited to an HB structure.

The semiconductor chip stack SCa may be provided such that the lower chip 120a is flipped over and bonded to the upper chip 130. That is, the front surface Fb of the lower chip 120a may be bonded to the front surface Ft of the upper chip 130. Thus, as shown in FIG. 2, the front surface Fb of the lower chip 120a may face the upper chip 130, and the back surface Bb of the lower chip 120a may face the first redistribution substrate 110. In addition, the front surface Ft of the upper chip 130 may face the lower chip 120a, and the back surface Bt of the upper chip 130 may face the second redistribution substrate 180.

Referring to FIG. 3, a semiconductor package 100b may be different from the semiconductor package 100 in FIG. 1 in that no vertical contact is provided with the semiconductor package 100*b*. In some implementations, the semiconductor chip stack SC of the semiconductor package 100*b* includes the lower chip 120 and the upper chip 130. In the semiconductor chip stack SC, the back surface Bb of the lower chip 120 may be bonded to the front surface Ft of the upper chip 130 by the bonding layer BL. In another implementation, the front surface Fb of the lower chip 120 may be bonded to the front surface Ft of the upper chip 130 by the bonding layer BL like the semiconductor package 100*a* in FIG. 2.

In some implementations, the back surface Bt of the upper chip 130 of the semiconductor chip stack SC directly contacts the second redistribution substrate 180. That is, no encapsulant 160 may be positioned between the upper chip 130 and the second redistribution substrate 180, so that no vertical contact is provided between the upper chip 130 and the second redistribution substrate 180. Although not shown in the drawings, a plurality of the chip pads that are arranged on the upper surface of the upper wiring layer 137 of the upper chip 130 may be connected to the substrate pads on the lower surface of the second redistribution substrate 180.

In some implementations, the thickness of the encapsulant 160 may be reduced, and a through post 150*a* may have a reduced height. Therefore, the total thickness of the semiconductor package 100*b* may be reduced. In addition, as no vertical contact is provided with the semiconductor package 100*b*, the semiconductor package 100*b* may be manufactured more easily. Furthermore, as vertical contacts are left out, a signal transfer path between a memory chip on the second redistribution substrate 180 and the upper chip 130, which is an AP chip, may be further shortened, to thereby improve the operation performance of the semiconductor package 100*b*.

In a structure of the semiconductor package 100*b* in which vertical contacts are left out, the through post 150 may have a bimetal layer structure. In some implementations, the through post 150 includes a lower metal layer comprising copper (Cu), and an upper metal layer comprising nickel (Ni). As the upper metal layer may include nickel (Ni) and be positioned at an upper portion of the through post 150, the through post 150 may be prevented from copper (Cu) contamination in a grinding process of an upper portion of the encapsulant 160.

FIG. 4 is a cross-sectional view illustrating an example of a semiconductor package. The same descriptions as given with reference to FIGS. 1 to 3 are given briefly or omitted.

Referring to FIG. 4, a semiconductor package 1000 may be different from the semiconductor package 100 in FIG. 1 in that the semiconductor package 1000 includes the upper package 200. In some implementations, the semiconductor package 1000 includes a lower package 100*c* and the upper package 200. The lower package 100*c* in FIG. 4 may include the semiconductor package 100 in FIG. 1. However, the lower package 100*c* may also include the semiconductor package 100*a* in FIG. 2, and the semiconductor package 100*b* in FIG. 3.

The upper package 200 may include a semiconductor chip 210, an upper package substrate 220, and an upper encapsulant 230. The semiconductor chip 210 may include a volatile memory device, such as a dynamic random access memory (DRAM) device and a static random access memory (SRAM) device, and a nonvolatile memory device, such as a flash memory device. While the semiconductor chip 210 having a single layer chip structure is stacked on the upper package substrate 220 in FIG. 4, a memory device having a multilayer stacked chip structure, instead of a single chip structure, may be stacked on the upper package substrate 220. In some implementations, a memory device having a multilayer chip structure is mounted on the upper package substrate 220 by bumps and bonding wires or by TSVs.

The upper package substrate 220 may include, for example, a ceramic substrate, a printed circuit board (PCB), a glass substrate, and an interpose substrate. In the semiconductor package 1000, a PCB may be provided as the upper package substrate 220. A plurality of inter-substrate contact terminals 250, such as bumps and solder balls, may be arranged on a lower surface of the upper package substrate 220. The upper package 200 may be stacked on the second redistribution substrate 180 through the inter-substrate contact terminals 250.

The upper encapsulant 230 may seal the semiconductor chip 210, so that the physical and chemical damages to the semiconductor chip 210 may be prevented by the upper encapsulant 230. When the semiconductor chip 210 is stacked on the upper package substrate 220 by using bumps, the upper encapsulant 230 may fill gap spaces between the semiconductor chip 210 and the upper package substrate 220, and between the bumps. In another implementation, an underfill may fill a gap space between bumps.

Figure 5A:
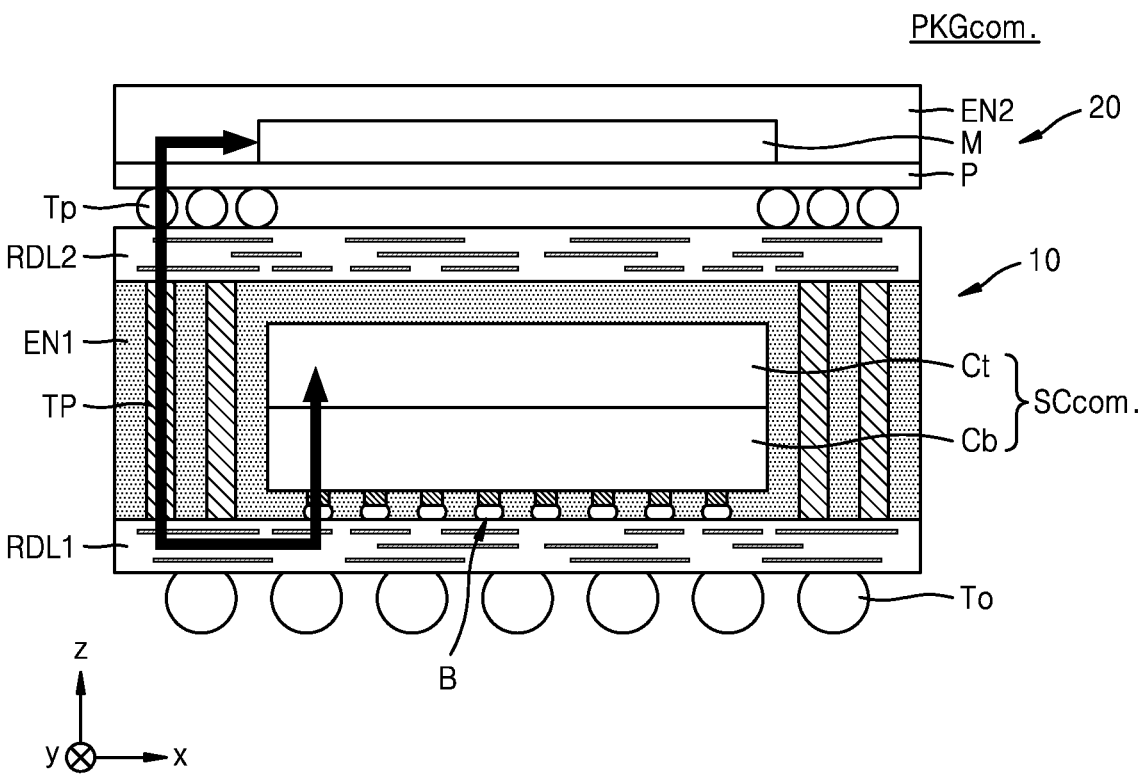
FIGS. 5A and 5B are respectively cross-sectional views illustrating a semiconductor package according to a comparative example and a semiconductor package of FIG. 4, for description of a signal transfer path.
Figure 5B:
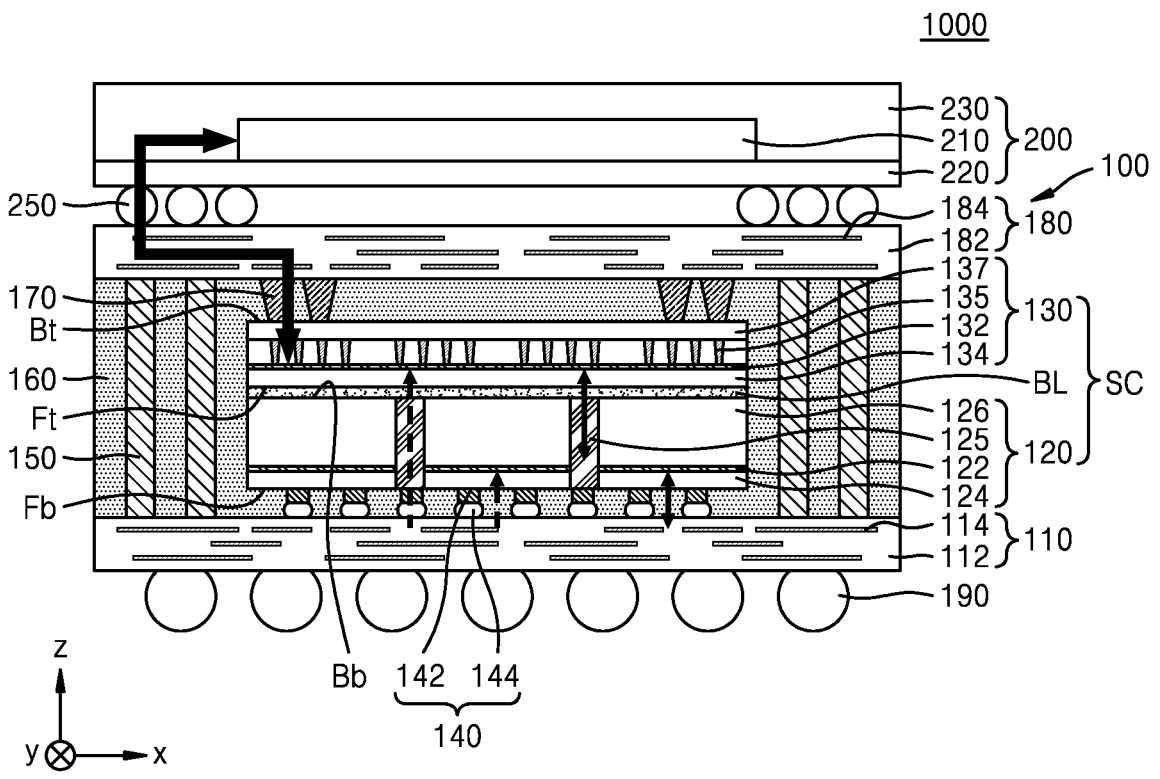

FIGS. 5A and 5B are respectively cross-sectional views illustrating a semiconductor package according to a comparative example and a semiconductor package of FIG. 4, for description of a signal transfer path.

Referring to FIG. 5A, in a comparative semiconductor package PKGcom., the comparative semiconductor chip stack SCcom. of a comparative lower package 10 includes a bottom chip Cb and a top chip Ct. However, the top chip Ct does not include a nano through-electrode and an upper wiring layer. Thus, no vertical contact may be positioned between the top chip Ct and a second redistribution substrate RDL2. Based on the package structure described above, a signal may be transferred between the bottom chip Ct including an AP chip and an upper package 20 including a memory chip M along a path which is shown as a bidirectional bold arrow line in FIG. 5A. That is, a signal may be transferred along a following signal transfer path, which includes turns instead of only straight lines: the top chip Ct □ the bottom chip Cb □ a bump B □ a first redistribution substrate RDL1 □ a through post TP □ the second redistribution substrate RDL2 □ an inter-substrate contact terminal Tp □ an upper package substrate P □ the memory chip M. In the comparative semiconductor package PKGcom., the long signal transfer path can deteriorate the operation performance in a view of system level. For example, the heat reduction, the SI characteristics, and the performance ratio to the power consumption of the comparative semiconductor package PKGcom. are deteriorated by the long signal transfer path. In FIG. 5A, the symbol 'To' denotes an external contact terminal, and the symbols 'EN1' and 'EN2' denote an encapsulant.

Referring to FIG. 5B, in some implementations, the semiconductor chip stack SC of the lower package 100*c* includes the lower chip 120 and the upper chip 130. In addition, the upper chip 130 may include the nano through-electrode 135 and the upper wiring layer 137. Furthermore, the vertical contact 170 may be positioned between the upper chip 130 and the second redistribution substrate 180. Based on the package structure described above, the signal is transferred between the upper chip 130 and the semiconductor chip 210 along a signal path which is shown as a bidirectional bold arrow line in FIG. 5B. That is, the signal is transferred in the following signal transfer path: the upper chip 130 □ the vertical contact 170 □ the second redistribution substrate 180 □ the inter-substrate contact terminal 250 □ the upper package substrate 220 □ the semiconductor chip 210. In some implementations, the operation performance, such as heat reduction, SI characteristics, and the performance ratio to the power consumption, is sufficiently improved due to the shortened signal transfer path.

In addition, in FIG. 5B, a pair of unidirectional dashed arrow lines may indicate that the power is transferred to the lower chip 120 and the upper chip 130 from the first redistribution substrate 110. Furthermore, a pair of bidirectional arrow lines may indicate signal transfer paths between the first redistribution substrate 110 and the lower chip 120. Although not shown in the drawings, the power may be transferred to the upper package 200 from the first redistribution substrate 110 through the through post 150, the second redistribution substrate 180, and the inter-substrate contact terminal 250. The structure in which the signal transfer path between the memory chip and the AP chip is minimized is referred to as a near memory structure, a near memory computing structure, or a near memory processing structure. Thus, the semiconductor package 1000 may be the near memory structure.

Figure 6:
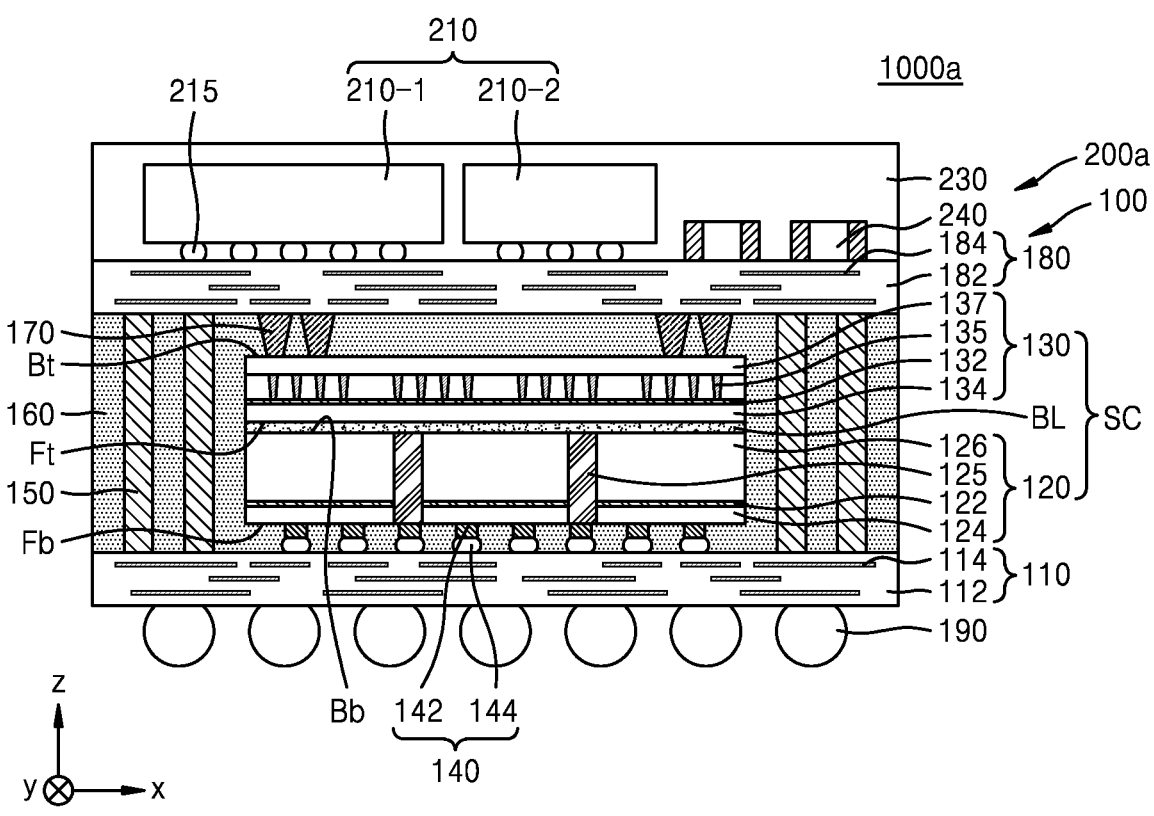
FIG. 6 is a cross-sectional view illustrating another example of a semiconductor package.

FIG. 6 is a cross-sectional view illustrating another example semiconductor package. The same descriptions as given with reference to FIGS. 1 to 5B are given briefly or omitted.

Referring to FIG. 6, a semiconductor package 1000a may be different from the semiconductor package 1000 in FIG. 4 in a structure of an upper package 200a. In some implementations, the semiconductor package 1000a includes the lower package 100c and the upper package 200a. The lower package 100c in FIG. 6 may include the semiconductor package 100 in FIG. 1. However, the lower package 100c may also include the semiconductor package 100a in FIG. 2 or the semiconductor package 100b in FIG. 3.

The upper package 200a may include at least one upper semiconductor chip 210, at least one passive device 240, and the upper encapsulant 230. The upper semiconductor chip 210 may include a memory chip. In some implementations, the memory chip includes a volatile memory device and a nonvolatile memory device. However, the upper semiconductor chip 210 is not limited to the memory chip. In another implementation, the upper semiconductor chip 210 may include a logic chip.

As shown in FIG. 6, the upper package 200a may include two upper semiconductor chips 210-1 and 210-2. The two upper semiconductor chips 210-1 and 210-2 may be the same semiconductor chips, or may be different from each other. The upper semiconductor chip 210 in the upper package 200 is not limited to two chips. In another implementation, the upper package 200 may include a single upper semiconductor chip 210 or three or more upper semiconductor chips 210. At least one of the two upper semiconductor chips 210-1 and 210-2 may include a multilayer chip structure in which a plurality of chips are stacked. The upper semiconductor chip 210 may be mounted directly on the second redistribution substrate 180 by bumps 215. In another implementation, the upper semiconductor chip 210 may be mounted on the second redistribution substrate 180 by bonding wires instead of the bumps 215.

The passive device 240 may include a 2-terminal device, such as a resistor, a capacitor, and an inductor. In FIG. 6, two passive devices 240 are arranged on the second redistribution substrate 180. However, the number of passive devices 240 on the second redistribution substrate 180 is not limited to two. The upper encapsulant 230 may seal the upper semiconductor chip 210 and the passive devices 240, so that the physical and chemical damages to the upper semiconductor chip 210 and the passive devices 240 are prevented by the upper encapsulant 230.

FIGS. 7A to 7E are cross-sectional views illustrating a method of forming an upper chip of the semiconductor chip stack in the semiconductor package in FIG. 1. The method of forming the upper chip of the semiconductor chip stack is described in detail with reference to FIGS. 7A to 7E together with FIG. 1, and the same descriptions as given with reference to FIGS. 1 to 6 are given briefly or omitted.

Figure 7A:
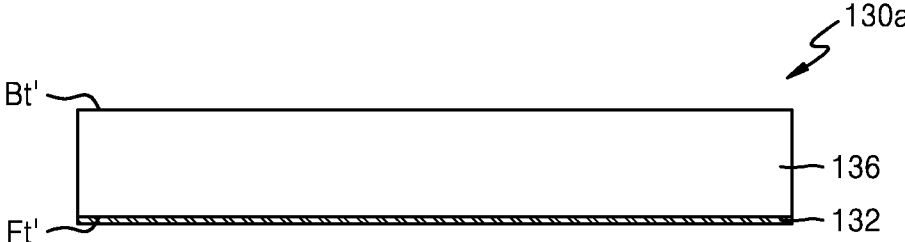
FIGS. 7A to 7E are cross-sectional views illustrating a method of forming an upper chip of the semiconductor chip stack in the semiconductor package in FIG. 1.

Referring to FIG. 7A, the integrated circuit layer 132 may be formed on a first substrate 136, to thereby form an upper chip 130a. In some implementations, the upper chip 130a includes an AP chip, and thus, the integrated circuit layer 132 may include a plurality of logic devices. In FIG. 7A, a lower surface of the first substrate 136 on which the integrated circuit layer 132 is formed may be provided as a front surface Ft', and an upper surface of the first substrate 136 opposite to the lower surface may be provided as a back surface Bt'.

Figure 7B:
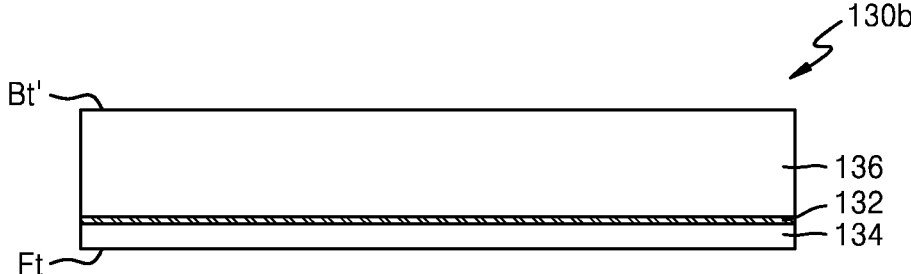

Referring to FIG. 7B, after forming the integrated circuit layer 132, the lower wiring layer 134 may be formed on the integrated circuit layer 132. The lower wiring layer 134 may include an insulation layer and a plurality of multilayered wirings in the insulation layer. A lower surface of the lower wiring layer 134 may correspond to a front surface Ft of an upper chip 130b, and the upper surface of the first substrate 136 may correspond to the back surface Bt' in the upper chip 130b.

Figure 7C:
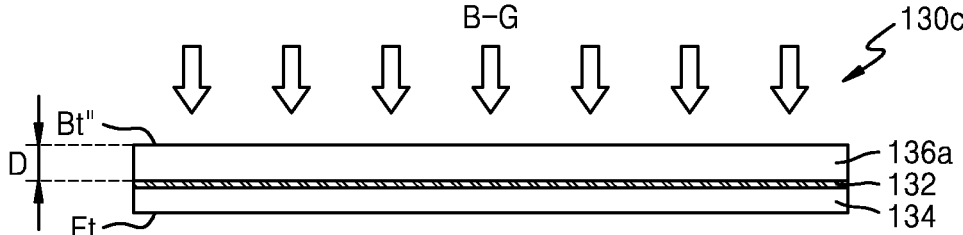

Referring to FIG. 7C, after forming the lower wiring layer 134, a back grinding process B-G may be performed on the back surface Bt' of the first substrate 136, to thereby make the first substrate 136 thin. In some implementations, the back grinding process B-G includes a chemical mechanical polishing (CMP) process. After performing the back grinding process B-G, a first substrate 136a may have a thickness D of about 100 nm or less. In addition, an upper surface of the first substrate 136a may be provided as a back surface Bt" of an upper chip 130c.

Figure 7D:
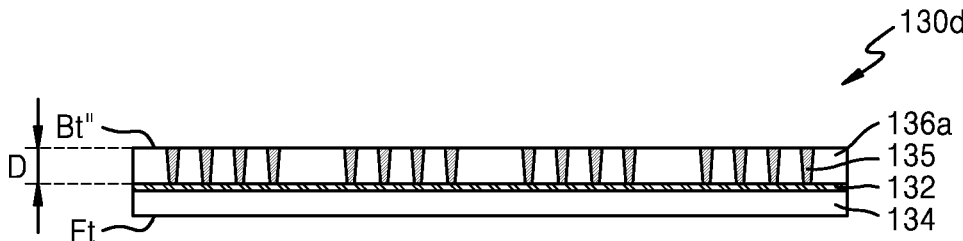

Referring to FIG. 7D, after performing the back grinding process B-G, a plurality of nano through-electrodes 135 penetrating through the first substrate 136a may be formed. As the nano through-electrode 135 may penetrate the first substrate 136a including silicon (Si), the nano through-electrode 135 may be referred to as a TSV. In addition, as the nano through-electrode 135 may penetrate through the first substrate 136a, the nano through-electrode 135 may have a height corresponding to the thickness D of the thinned first substrate 136a. Thus, the height of the nano through-electrode 135 may be about 100 nm or less. In another implementation, the nano through-electrode 135 may also penetrate through the integrated circuit layer 132. In the structure as described above, the height of the nano through-electrode 135 may increase as high as the thickness of the integrated circuit layer 132. When the formation of the nano through-electrode 135 is completed, the upper surface of the first substrate 136a may be provided as the back surface Bt" of the upper chip 130d.

Figure 7E:
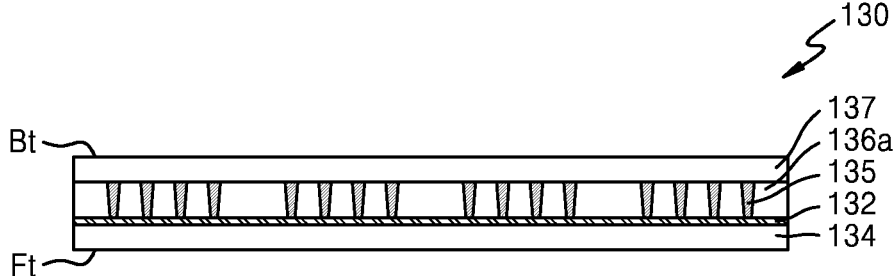

Referring to FIG. 7E, after the nano through-electrode 135 is formed, the upper wiring layer 137 may be formed on the first substrate 136a and the nano through-electrode 135. The upper wiring layer 137 may include an insulation layer and a plurality of multilayered wirings in the insulation layer. The multilayered wirings of the upper wiring layer 137 may be connected to the nano through-electrodes 135. The upper chip 130 may be completed by the formation of the upper wiring layer 137. When the upper wiring layer 137 is formed on the upper chip 130*d*, the lower surface of the lower wiring layer 134 may correspond to the front surface Ft of the upper chip 130, and the upper surface of the upper wiring layer 137 may correspond to the back surface Bt of the upper chip 130.

Figure 8A:
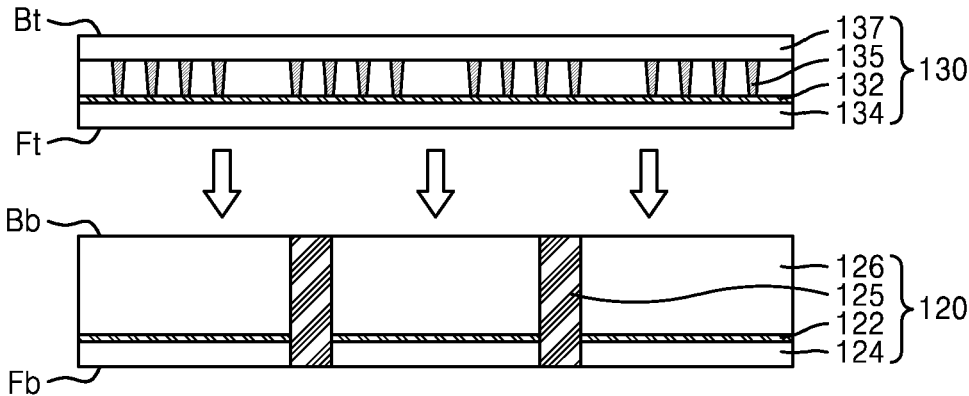
FIGS. 8A and 8B are cross-sectional views illustrating a method of forming a semiconductor chip stack in the semiconductor packages in FIGS. 1 and 2.
Figure 8B:
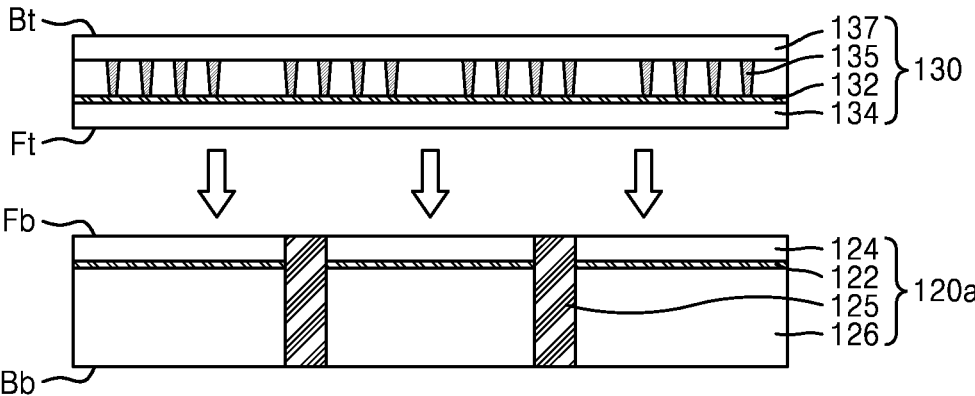

FIGS. 8A and 8B are cross-sectional views illustrating a method of forming a semiconductor chip stack in the semiconductor packages in FIGS. 1 and 2. The method of forming a semiconductor chip stack is described in detail with reference to FIGS. 8A and 8B together with FIGS. 1 and 2.

Referring to FIG. 8A, the upper chip 130 may be mounted on the lower chip 120 and be bonded to the lower chip 120, to thereby form the semiconductor chip stack SC of the semiconductor package 100 in FIG. 1. In some implementations, the upper chip 130 is bonded to the lower chip 120 such that the front surface Ft of the upper chip 130 is bonded to the back surface Bb of the lower chip 120. In addition, the upper chip 130 may be bonded to the lower chip 120 by the bonding layer BL. In the semiconductor package 100 in FIG. 1, the bonding layer BL of the semiconductor chip stack SC may have an HB structure. However, the structure of the bonding layer BL is not limited to the HB structure.

Referring to FIG. 8B, the upper chip 130 may be mounted on the lower chip 120*a* and be bonded to the lower chip 120*a*, to thereby form the semiconductor chip stack SCa of the semiconductor package 100*a* in FIG. 2. In some implementations, the upper chip 130 is bonded to the lower chip 120*a* such that the front surface Ft of the upper chip 130 is bonded to the front surface Fb of the lower chip 120*a*. In addition, the upper chip 130 may be bonded to the lower chip 120*a* by the bonding layer BL. In the semiconductor package 100*a* in FIG. 2, the bonding layer BL of the semiconductor chip stack SCa may have an HB structure. However, the structure of the bonding layer BL is not limited to the HB structure.

FIGS. 9A to 9K are cross-sectional views illustrating a method of manufacturing the semiconductor package 100 shown in FIG. 1. The method of manufacturing the semiconductor package 100 is described in detail with reference to FIGS. 9A to 9K together with FIG. 1. The same descriptions as given with reference to FIGS. 1 to 8B are given briefly or omitted.

Figure 9A:
FIGS. 9A to 9K are cross-sectional views illustrating a method of manufacturing a semiconductor package shown in FIG. 1.

Referring to FIG. 9A, in the method of manufacturing the semiconductor package 100, the first redistribution substrate 110 may be provided at first. The first redistribution substrate 110 may include the first body insulation layer 112 and the first redistribution line 114, as described above. In some implementations, the first redistribution substrate 110 is formed on a carrier substrate 600. The carrier substrate 600 may include a large-sized substrate, such as a wafer. Also, a redistribution substrate, which is entirely formed on the carrier substrate 600, may also be a large-sized substrate on which a plurality of the first redistribution substrates 110 are arranged.

After a plurality of subsequent elements for the plurality of first redistribution substrates 110 may be formed on the large-sized redistribution substrate, the large-sized redistribution substrate having the subsequent elements thereon may be separated individually into a plurality of the semiconductor packages 100 in a singulation process, which are each referred to as a wafer level package (WLP). FIG. 9A and FIGS. 9B to 9K subsequently following FIG. 9A show a single unit of the first redistribution substrate 110 having the subsequent elements thereon for convenience.

Thereafter, a seed metal 155 may be formed on the first redistribution substrate 110. The seed metal 155 may be used in a subsequent electroplating process for forming the through post 150. The seed metal 155 may include a metal-based material. Examples of the metal-based material may include copper (Cu), titanium (Ti), tantalum (Ta), titanium nitride (TiN), tantalum nitride (TaN), etc. In some implementations, the seed metal 155 includes copper (Cu) in the method of manufacturing the semiconductor package.

Figure 9B:
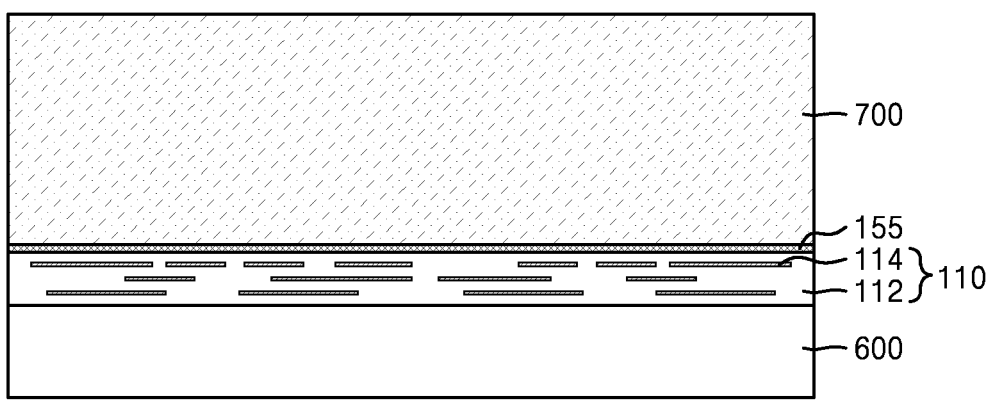

Referring to FIG. 9B, a photoresist (PR) 700 may be applied on the seed metal 155 of the first redistribution substrate 110. In some implementations, the PR 700 is coated on the seed metal 155 in a spin coating process using a spin coater. The PR 700 may have a thickness corresponding to a height of the through post 150.

Figure 9C:
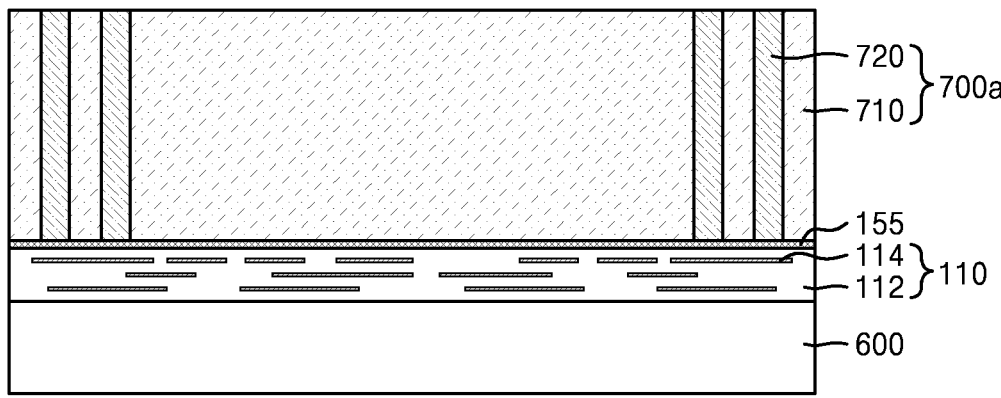

Referring to FIG. 9C, a light exposure process may be performed after applying the PR 700. The light exposure process may be performed by using a mask having a preset pattern. In some implementations, light is transmitted through a transparent portion of a transmissive mask to thereby irradiate preset portions of the PR 700 with light. Chemical characteristics of the portions of the PR 700 with light may be changed. Thus, after the light exposure process, a PR 700*a* may be distinguished between an unexposed portion 710 and an exposed portion 720. As shown in FIG. 9C, the exposed portion 720 may be arranged at a peripheral portion of the first redistribution substrate 110.

Figure 9D:
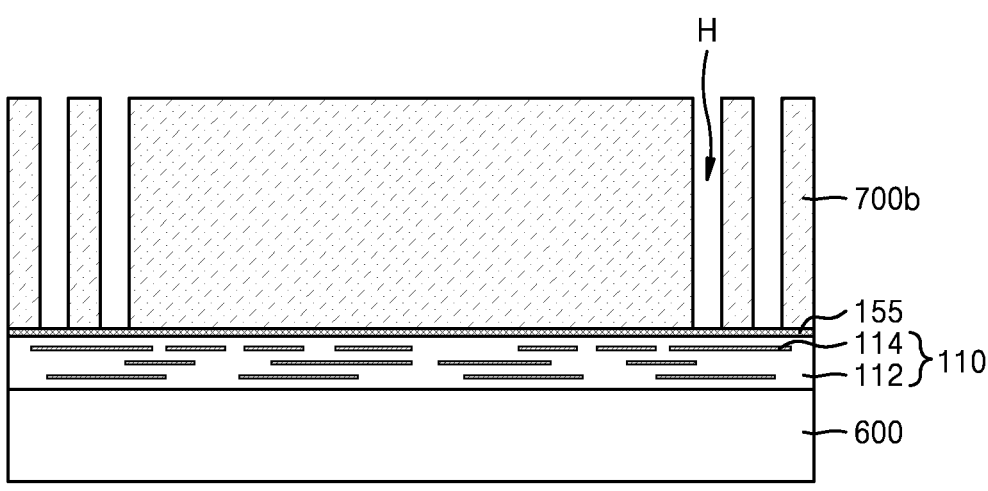

Referring to FIG. 9D, a developing process may be performed on the PR 700*a* after the light exposure process. In the developing process, for example, the exposed portion 720 may be removed. For example, the PR 700*a* may include a positive PR. In another implementation, a negative PR may be used. In such a case, an unexposed portion may be removed in the developing process.

A PR pattern 700*b* may be formed by removing the exposed portion 720 in the developing process. The PR pattern 700*b* may include a plurality of through holes H. The seed metal 155 may be exposed through bottom surfaces of the through holes H. Byproducts, such as PR scum, of the developing process may remain in the through holes H after the developing process. Thus, a cleaning process may be performed to remove the PR scum. The removal process for removing the PR scum is referred to as a PR descum process. The cleaning process may include the PR descum process.

Figure 9E:
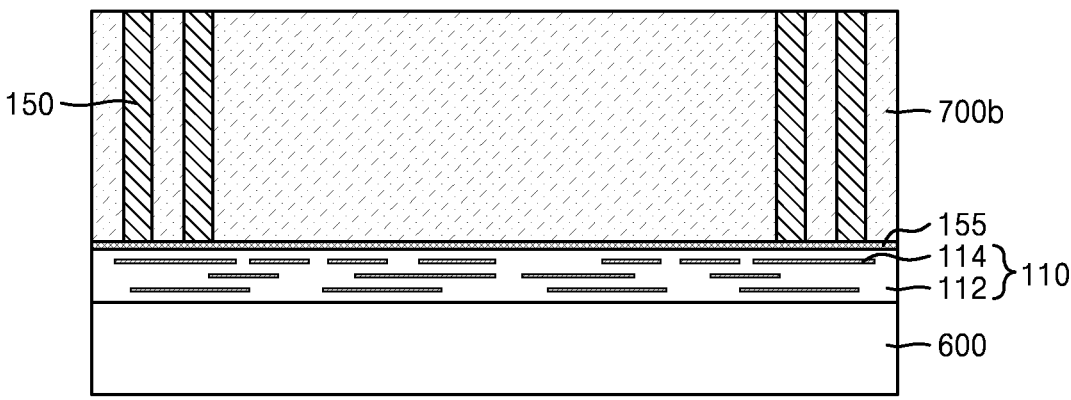

Referring to FIG. 9E, after completing the cleaning process, an electroplating process may be performed to form the through post 150 in the through holes H. The through post 150 may include copper (Cu). Although not shown in the drawings, the through post 150 may remain on a portion of an upper surface of the PR pattern 700*b* adjacent to through holes H aside from the through holes H.

Figure 9F:

Referring to FIG. 9F, the PR pattern 700*b* may be removed after the formation of the through post 150. The PR pattern 700*b* may be removed by a strip/ashing process. When the PR pattern is removed, the seed metal 155 may be exposed between a plurality of through posts 150. Then, the seed metal 155 exposed between the through posts 150 may be removed by an etching process. Thus, an upper surface of the first redistribution substrate 110 may be exposed by removing the seed metal 155. A seed metal 155*a* on a lower surface of the through posts 150 may be maintained as it is. As the seed metal 155*a* and the through posts 150 have the same material, copper (Cu), the seed metal 155*a* is omitted in FIGS. 9G to 10D.

Figure 9G:
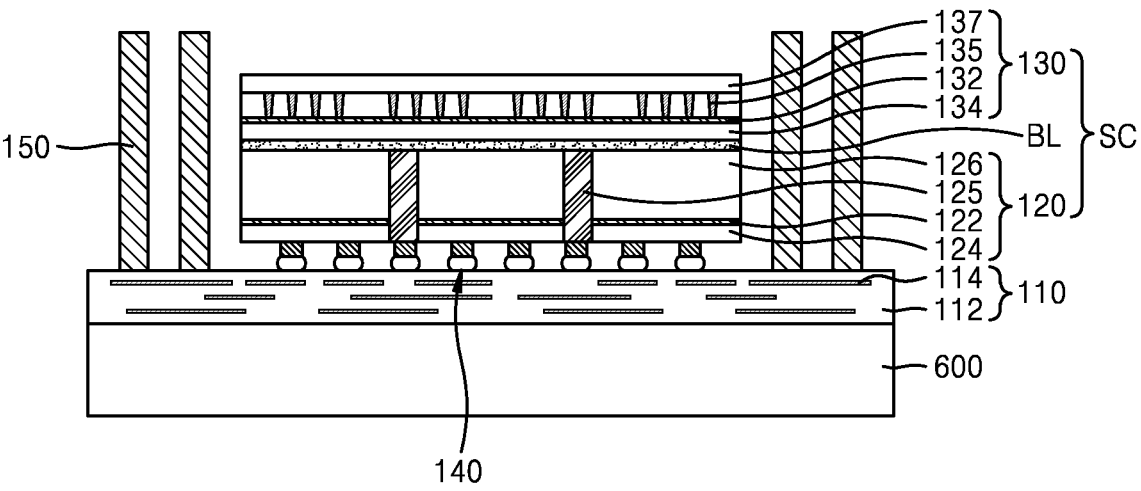

Referring to FIG. 9G, the semiconductor chip stack SC may be mounted on a central portion of the first redistribution substrate 110. In some implementations, the semiconductor chip stack SC is mounted on the first redistribution substrate 110 in a flip chip structure by the bumps 140. The underfill may optionally be filled in a gap space between the first redistribution substrate 110 and the semiconductor chip stack SC, and between the bumps 140.

Figure 9H:
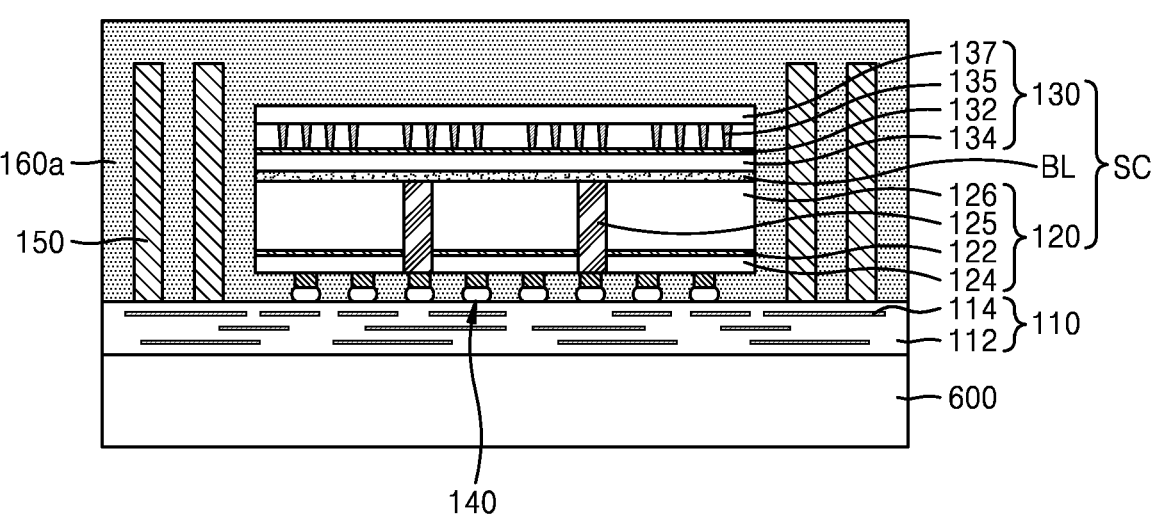

Referring to FIG. 9H, after mounting the semiconductor chip stack SC, an encapsulant 160a may be formed on the first redistribution substrate 110 to cover the semiconductor chip stack SC and the through posts 150. Thus, upper surfaces and side surfaces of the semiconductor chip stack SC and the through posts 150 may be covered by the encapsulant 160a. The material of the encapsulant 160a is the same as described with reference to the encapsulant 160 of the semiconductor package 100 in FIG. 1.

Figure 9I:
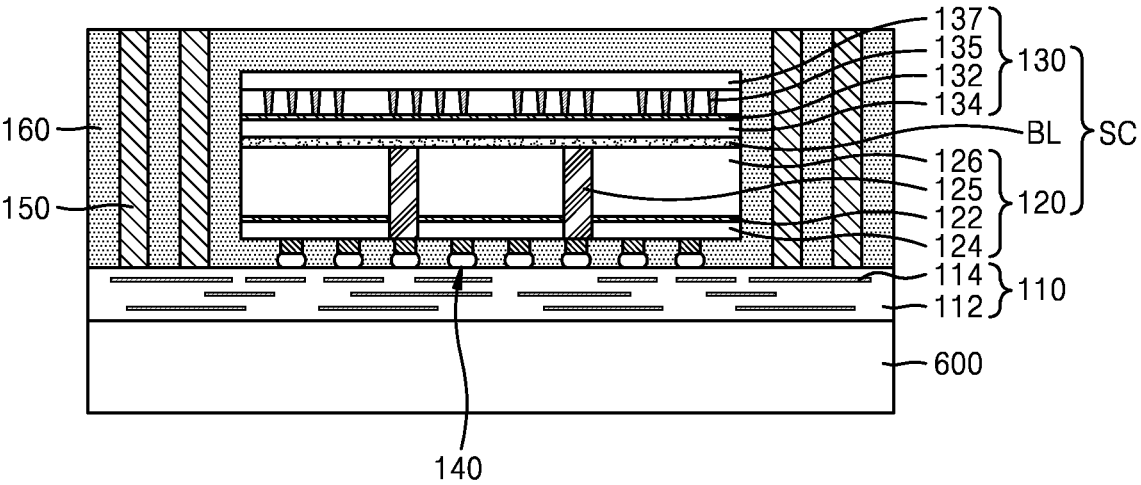

Referring to FIG. 9I, a planarization process for removing an upper portion of the encapsulant 160a may be performed. In some implementations, the planarization process is performed by, for example, CMP. Thus, the upper surfaces of the through posts 150 may be exposed through the planarization process performed on the encapsulant 160. In some implementations, the through posts 150 are used as a planarizing stopper layer in the planarization process performed on the encapsulant 160a. When the planarization process is completed, the upper surface of the encapsulant 160 may be substantially coplanar with the upper surfaces of the through posts 150. As shown in FIG. 9I, the encapsulant 160 may still remain on the semiconductor chip stack SC with a preset thickness after the planarization process.

Figure 9J:
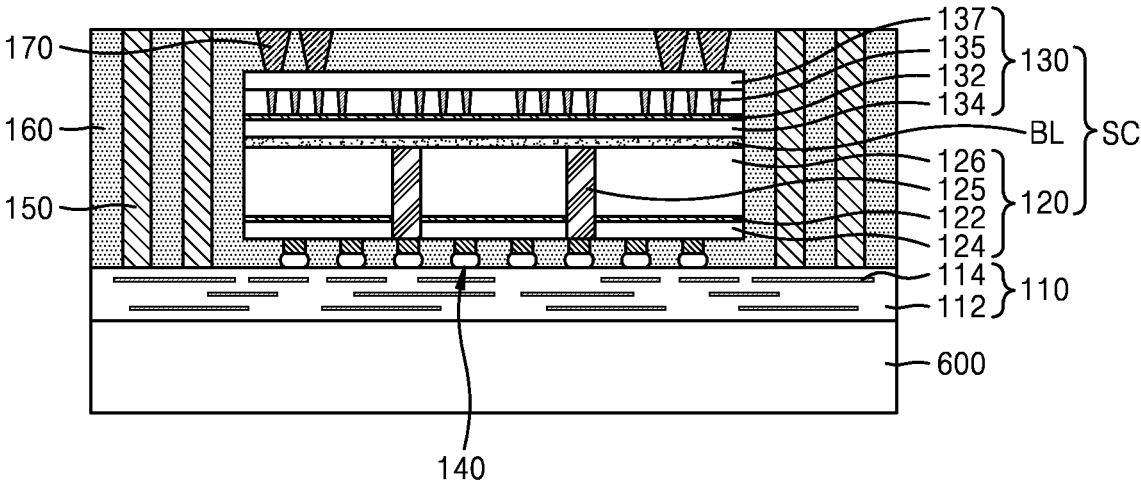

Referring to FIG. 9J, the vertical contacts 170 that penetrate through the encapsulant 160 on semiconductor chip stack SC to be connected to the semiconductor chip stack SC are formed. The vertical contacts 170 may be connected to the wirings of the upper wiring layer 137 via the chip pads that are arranged on the upper surface of the upper chip 130. Upper surfaces of the vertical contacts 170 may be exposed from the encapsulant 160.

Figure 9K:
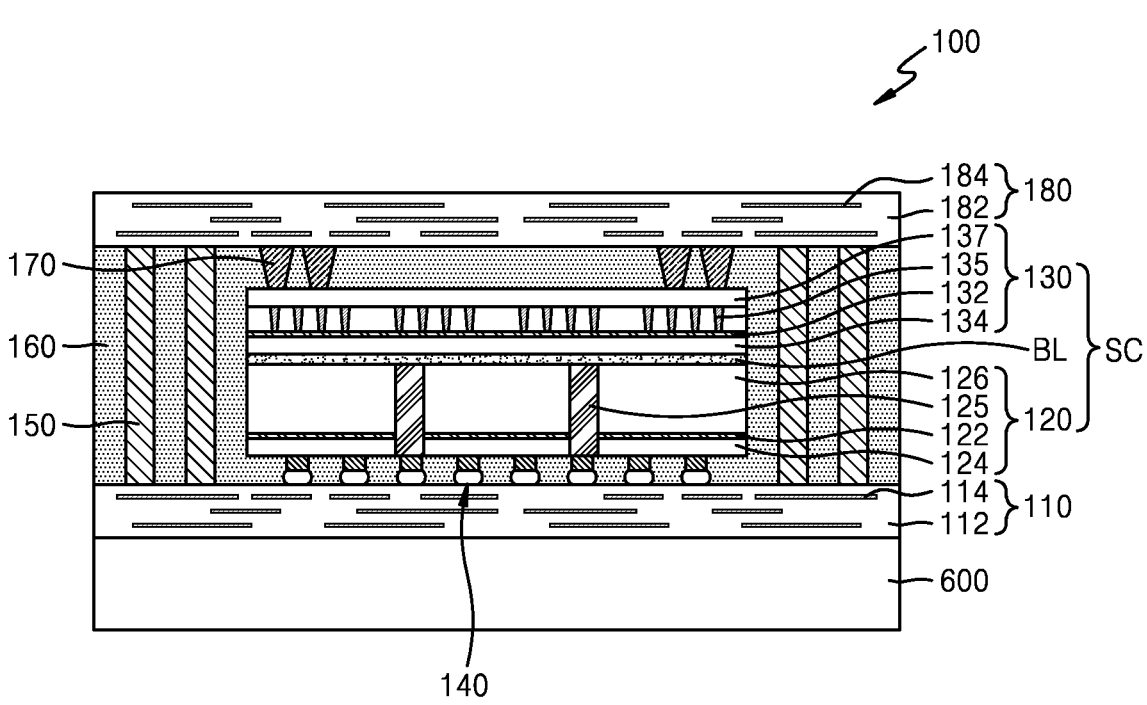

Referring to FIG. 9K, the second redistribution substrate 180 may be formed on the through posts 150, the encapsulant 160, and the vertical contacts 170. The second redistribution substrate 180 may include the second body insulation layer 182 and the second redistribution line 184. The second redistribution line 184 of the second redistribution substrate 180 may be connected to the through posts 150 and the vertical contacts 170. The second redistribution substrate 180 may have substantially the same structures as the second redistribution substrate 180 as described in detail with reference to FIG. 1.

Thereafter, the carrier substrate 600 may be removed from the first redistribution substrate 110, and then, the external contact terminal 190 may be formed on the lower surface of the first redistribution substrate 110. The manufacture of the semiconductor package in FIG. 1 may be completed by the formation of the external contact terminal 190. As described above, the manufacturing processes described with references FIG. 9A to 9K may be performed at wafer level, the semiconductor package 100 in FIG. 1 may be completed through a singulation process for separating into individual semiconductor packages.

FIGS. 10A to 10D are cross-sectional views illustrating a method of manufacturing the semiconductor package 100b shown in FIG. 3. The method of manufacturing the semiconductor package 100b is described in detail with reference to FIGS. 10A to 10D together with FIG. 3. The same descriptions as given with reference to FIGS. 1 to 9K are given briefly or omitted.

Figure 10A:
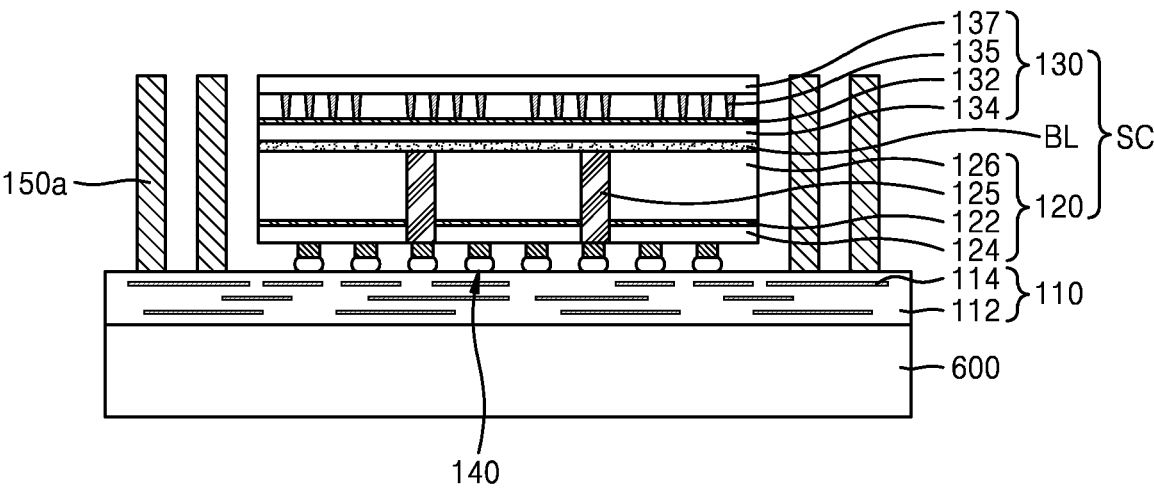
FIGS. 10A to 10D are cross-sectional views illustrating a method of manufacturing a semiconductor package shown in FIG. 3.

Referring to FIG. 10A, in some implementations of manufacturing the semiconductor package, a plurality of the through posts 150a are formed on the first redistribution substrate 110 in the same processes as described with reference to FIGS. 9A to 9F. Thereafter, the semiconductor chip stack SC may be mounted on a central portion of the first redistribution substrate 110. In some implementations, the semiconductor chip stack SC is mounted on the first redistribution substrate 110 in a flip chip structure by using a plurality of the bumps 140. As shown in FIG. 10A, the upper surface of the semiconductor chip stack SC may have a height similar to that of the through post 150a.

In some implementations, when the semiconductor chip stack SC and the through posts 150a are configured to have upper surfaces at a similar level, each through post 150a is configured as a bimetal layer structure having a lower metal layer and an upper metal layer. In the bimetal layer structure, the lower metal layer may include copper (Cu), and the upper metal layer may include nickel (Ni). The upper metal layer including Ni may also be formed by an electroplating process. When the through post 150a includes the upper metal layer including nickel (Ni), the semiconductor chip stack SC may be prevented from copper (Cu) contamination in advance in a subsequent planarization process.

Figure 10B:
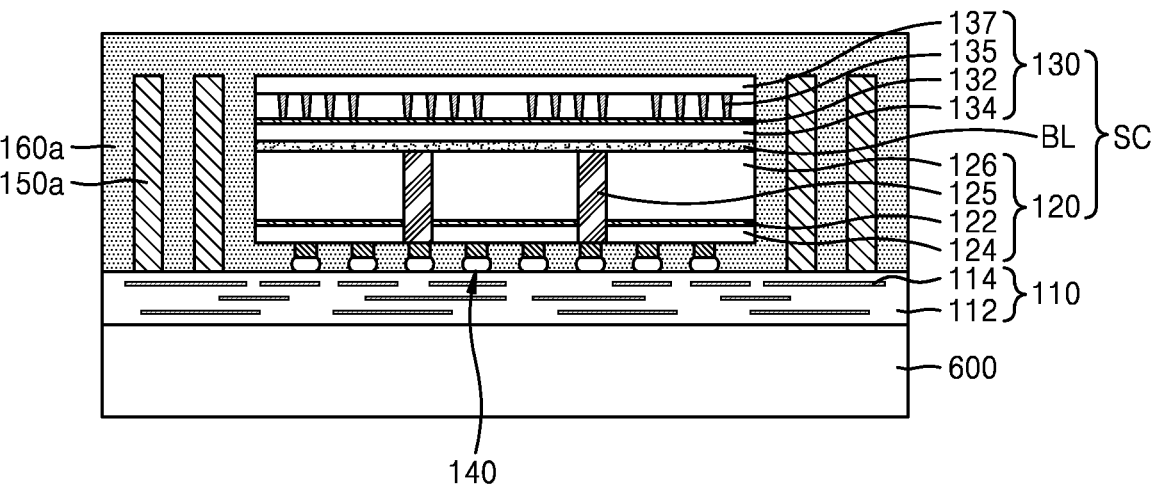

Referring to FIG. 10B, after the semiconductor chip stack SC is mounted, the encapsulant 160a may be formed on the first redistribution substrate 110 to cover the semiconductor chip stack SC and the through posts 150a. Thus, the encapsulant 160a may cover side surfaces and upper surfaces of the semiconductor chip stack SC and the through posts 150a.

Figure 10C:
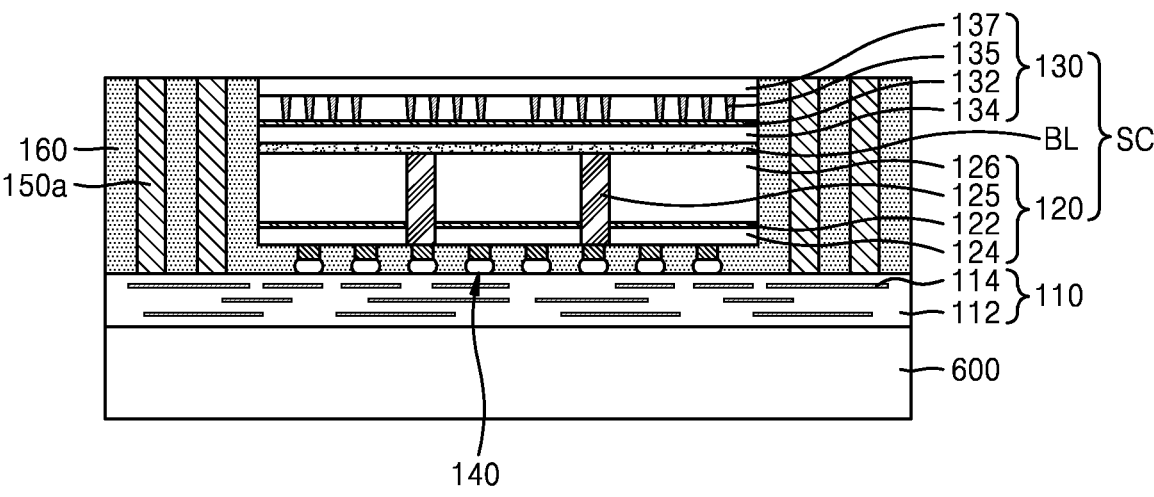

Referring to FIG. 10C, a planarization process may be performed on the encapsulant 160a, to thereby remove an upper portion of the encapsulant 160a. The planarization process may be performed through, for example, CMP. The upper surfaces of the semiconductor chip stack SC and the through posts 150a may be exposed from the encapsulant 160 through the planarization process performed on the encapsulant 160a. In some implementations, the through posts 150a and/or the semiconductor chip stack SC are used as a planarizing stopper layer in the planarization process performed on the encapsulant 160a. After the planarization process performed on the encapsulant 160a, the upper surfaces of the through posts 150a and the semiconductor chip stack SC may be substantially coplanar with an upper surface of the encapsulant 160.

When the through posts 150a are configured as having the bimetal layer structure, the upper metal layer including nickel (Ni) may be exposed from the encapsulant 160 in the planarization process performed on the encapsulant 160a. Thus, the semiconductor chip stack SC may be prevented from the copper (Cu) contamination, even when the semiconductor chip stack SC is exposed from the encapsulant 160. In some implementations, the upper chip 130 of the semiconductor chip stack SC includes the upper wiring layer 137 at the upper portion thereof. Thus, the semiconductor chip stack SC may be prevented from copper (Cu) contamination, even when the through posts 150a include a single copper (Cu) layer.

Figure 10D:
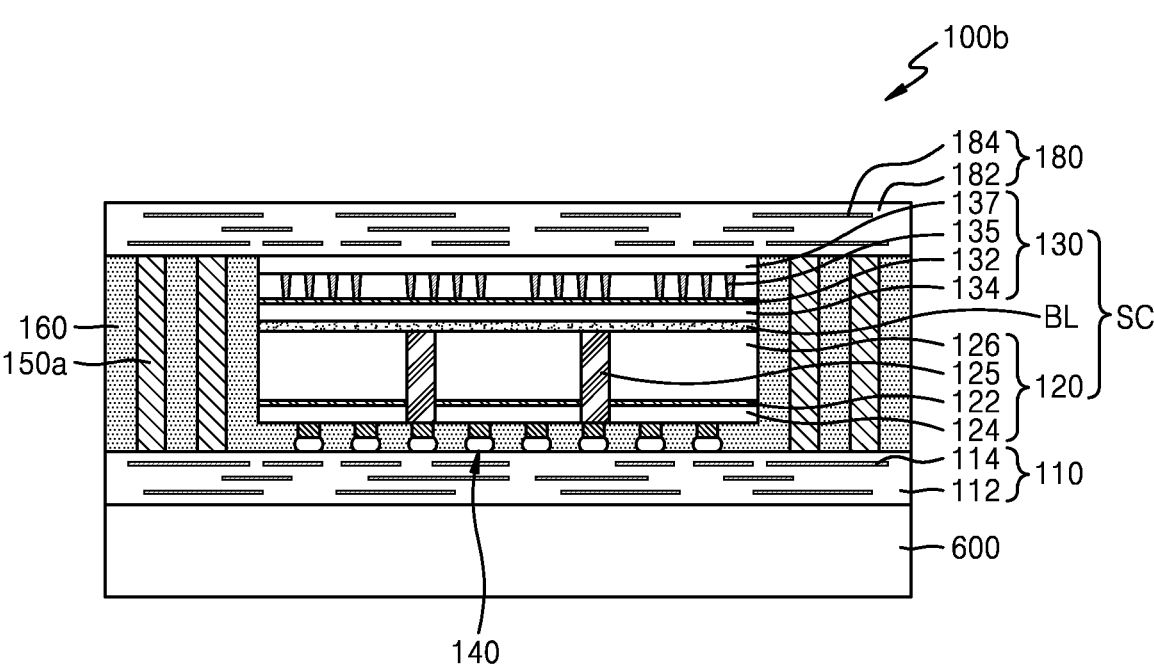

Referring to FIG. 10D, the second redistribution substrate 180 may be formed on the through posts 150a, the semiconductor chip stack SC, and the encapsulant 160. The second redistribution substrate 180 may include the second body insulation layer 182 and the second redistribution line 184. The second redistribution line 184 of the second redistribution substrate 180 may be connected with the through posts 150 and the upper wiring layer 137 of the upper chip 130.

Thereafter, the carrier substrate 600 may be removed from the first redistribution substrate 110, and then, the external contact terminal 190 may be formed on the lower surface of the first redistribution substrate 110. The semiconductor package 100*b* in FIG. 3 may be completed by the formation of the external contact terminal 190. As described above, the processes described with references FIG. 10A to 10D may be performed on at wafer level, the semiconductor package 100*b* in FIG. 3 may be completed through a singulation process for separating into individual semiconductor packages.

While the inventive concept has been particularly shown and described with reference to examples thereof, it will be understood that various changes in form and details may be made therein without departing from the spirit and scope of the following claims.

What is claimed is:

1. A semiconductor package comprising:
   a first redistribution substrate;
   a semiconductor chip stack arranged on the first redistribution substrate, wherein the semiconductor chip stack includes a lower chip and an upper chip;
   a through post arranged on the first redistribution substrate and laterally spaced apart from the semiconductor chip stack;
   a second redistribution substrate arranged on the semiconductor chip stack, and the through post;
   an encapsulant filling a gap space between the first redistribution substrate and the second redistribution substrate, wherein the encapsulant covers the semiconductor chip stack to seal the semiconductor chip stack, and
   wherein the upper chip includes an upper chip substrate, an integrated circuit layer on the upper chip substrate, and a through-electrode arranged on the integrated circuit layer, wherein the upper chip has a front surface, which is an active face and faces the lower chip, and a back surface, which is an inactive face and faces the second redistribution substrate, wherein the through-electrode extends from the integrated circuit layer through the upper chip substrate, and wherein the through post extends through the encapsulant to connect the first redistribution substrate to the second redistribution substrate.

2. The semiconductor package of claim 1, wherein the through-electrode is connected to the integrated circuit layer, or wherein the through-electrode is connected through the integrated circuit layer to a lower wiring layer that is under the integrated circuit layer.

3. The semiconductor package of claim 1, wherein the upper chip includes a lower wiring layer arranged under the integrated circuit layer, and an upper wiring layer arranged on the through-electrode.

4. The semiconductor package of claim 3, comprising an upper package arranged on the second redistribution substrate,
   wherein the upper chip includes an application process (AP) chip, and
   the upper chip is connected to the upper package through the through-electrode, the upper wiring layer, and the second redistribution substrate.

5. The semiconductor package of claim 1, further comprising a vertical contact that connects the semiconductor chip stack to the second redistribution substrate.

6. The semiconductor package of claim 1, wherein the upper chip and the lower chip are connected to each other by hybrid bonding, wherein the hybrid bonding comprises a combination of pad-to-pad bonding and insulator-to-insulator bonding.

7. The semiconductor package of claim 1, wherein the front surface of the upper chip is bonded to a front surface of the lower chip or wherein the front surface of the upper chip is bonded to a back surface of the lower chip.

8. The semiconductor package of claim 1, wherein the through-electrode has a height less than or equal to 100 nm.

9. The semiconductor package of claim 1, comprising an upper package arranged on the second redistribution substrate through an inter-substrate contact terminal, wherein the upper package comprises a memory chip,
   wherein the upper chip includes an application processor (AP) chip, and
   the upper chip is configured to transfer signals to the memory chip through the through-electrode, an upper wiring layer on the through-electrode, a vertical contact on the upper wiring layer, the second redistribution substrate, and the inter-substrate contact terminal.

10. A semiconductor package comprising:
    a first redistribution substrate;
    a semiconductor chip stack arranged on the first redistribution substrate, wherein the semiconductor chip stack comprises a lower chip and an upper chip;
    a through post arranged on the first redistribution substrate and laterally spaced apart from the semiconductor chip stack;
    an encapsulant enclosing a side surface of the through post, and covering the semiconductor chip stack, to seal the semiconductor chip stack;
    a second redistribution substrate arranged on the encapsulant, and the through post; and
    an external contact terminal arranged on a lower surface of the first redistribution substrate in a Fan-Out (FO) structure,
    wherein the upper chip includes an integrated circuit layer, a through-electrode on the integrated circuit layer, an upper wiring layer on the through-electrode, and a lower wiring layer under the integrated circuit layer.

11. The semiconductor package of claim 10, wherein the through-electrode is connected to the integrated circuit layer, or is connected to the lower wiring layer through the integrated circuit layer.

12. The semiconductor package of claim 10, further comprising an upper package on the second redistribution substrate,
    wherein the upper chip includes an application processor (AP) chip, and
    the upper chip is connected to the upper package through the through-electrode, the upper wiring layer, and the second redistribution substrate.

13. The semiconductor package of claim 10, wherein the upper chip and the lower chip are bonded to each other by hybrid bonding.

14. The semiconductor package of claim 13, wherein a front surface of the upper chip is bonded to a front surface of the lower chip, or the front surface of the upper chip is bonded to a back surface of the lower chip.

15. A semiconductor package comprising:
    a lower package;
    an upper package stacked on the lower package though an inter-substrate contact terminal; and
    an external contact terminal arranged on a lower surface of the lower package in a fan-out (FO) structure,
    wherein the lower package includes:
    a first redistribution substrate;

a semiconductor chip stack arranged on the first redistribution substrate, wherein the semiconductor chip stack comprises a lower chip and an upper chip;

a through post arranged on the first redistribution substrate and laterally spaced apart from the semiconductor chip stack;

a second redistribution substrate arranged on the semiconductor chip stack and the through post;

an encapsulant filling a gap space between the first redistribution substrate and the second redistribution substrate, wherein the encapsulant covers the semiconductor chip stack to seal the semiconductor chip stack, and wherein the upper chip includes an upper chip substrate, an integrated circuit layer on the upper chip substrate, a through-electrode arranged on the integrated circuit layer, an upper wiring layer on the through-electrode, and a lower wiring layer under the integrated circuit layer, wherein the through-electrode extends from the integrated circuit layer through the upper chip substrate, and wherein the through post extends through the encapsulant to connect the first redistribution substrate to the second redistribution substrate.

16. The semiconductor package of claim 15, wherein the through-electrode is connected to the integrated circuit layer, or wherein the through-electrode is connected through the integrated circuit layer to the lower wiring layer.

17. The semiconductor package of claim 15, wherein the upper package includes a memory chip, and is mounted on the second redistribution substrate through the inter-substrate contact terminal, and wherein the lower package further includes a vertical contact that connects the upper wiring layer and the second redistribution substrate with each other, wherein the upper chip includes an application processor (AP) chip, and wherein the upper chip is connected to the memory chip through the through-electrode, the upper wiring layer, the vertical contact, the second redistribution substrate, and the inter-substrate contact terminal.

18. The semiconductor package of claim 15, wherein the upper chip and the lower chip are bonded to each other by hybrid bonding, and wherein the semiconductor chip stack has a structure in which a front surface of the upper chip is bonded to a front surface of the lower chip or the front surface of the upper chip is bonded to a back surface of the lower chip.

* * * * *